US006936310B1

(12) United States Patent
Takeuchi et al.

(10) Patent No.: US 6,936,310 B1
(45) Date of Patent: Aug. 30, 2005

(54) PLASMA PROCESSING METHOD

(75) Inventors: Hiroaki Takeuchi, Tenri (JP); Tohru Okuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/541,089

(22) Filed: Mar. 31, 2000

(30) Foreign Application Priority Data

Apr. 2, 1999 (JP) .................................. 11-096859

(51) Int. Cl.$^7$ ............................. B05D 3/06; H05H 1/46
(52) U.S. Cl. ...................... 427/569; 427/578; 427/563;
427/562; 438/788; 438/792; 438/710; 216/67
(58) Field of Search ................................. 427/562, 563,
427/564, 569, 575, 577, 578, 579, 489, 490;
216/69, 70, 71, 67; 438/788, 789, 792, 793,
438/710, 711, 726, 729, 730

(56) References Cited

U.S. PATENT DOCUMENTS

| | | | | |
|---|---|---|---|---|
| 5,037,666 A | * | 8/1991 | Mori ........................... | 427/575 |
| 5,354,715 A | * | 10/1994 | Wang et al. ................. | 438/699 |
| 5,626,908 A | * | 5/1997 | Iio et al. ...................... | 427/575 |
| 5,827,785 A | * | 10/1998 | Bhan et al. .................. | 438/784 |
| 5,932,302 A | * | 8/1999 | Yamazaki et al. ........... | 427/577 |
| 6,001,728 A | * | 12/1999 | Bhan et al. .................. | 438/624 |
| 6,040,022 A | * | 3/2000 | Chang et al. ................ | 427/579 |
| 6,106,659 A | * | 8/2000 | Spence et al. .......... | 156/345.43 |
| 6,140,215 A | * | 10/2000 | Foster et al. ................ | 427/569 |
| 6,149,987 A | * | 11/2000 | Perng et al. ................. | 427/579 |
| 6,258,407 B1 | * | 7/2001 | Lee et al. ..................... | 427/569 |
| 6,291,028 B1 | * | 9/2001 | Gupta et al. ................. | 427/564 |
| 6,309,713 B1 | * | 10/2001 | Mak et al. ................... | 427/569 |
| 6,814,087 B2 | * | 11/2004 | Chandran et al. ............ | 134/1.1 |
| 2001/0018899 A1 | * | 9/2001 | Sharan et al. ................ | 438/680 |

FOREIGN PATENT DOCUMENTS

| | | |
|---|---|---|
| JP | 63050478 A | 3/1988 |
| JP | 1028810 A | 1/1989 |
| JP | 2050967 A | 2/1990 |
| JP | 5343338 | 12/1993 |
| JP | 6248457 | 9/1994 |
| JP | 6299358 | 10/1994 |

* cited by examiner

Primary Examiner—Marianne Padgett
(74) Attorney, Agent, or Firm—Birch, Stewart, Kolasch & Birch, LLP

(57) ABSTRACT

In a plasma processing method making use of a plasma processing gas of a reactant gas and an inert gas, it is aimed at enhancing an efficiency of use of high-frequency power and a reactant gas to increase a processing rate. The plasma processing method comprises supplying high frequency power to an electrode 2 opposed to a substrate 6 to thereby generate plasma between the electrode 2 and the substrate 6 on the basis of a plasma processing gas comprising a reactant gas and an inert gas to perform film formation, etching, surface treatment or the like on the substrate 6, pressure P(Torr) of the plasma processing gas being set to satisfy the following relationship $2 \times 10^{-7}(\text{Torr/Hz}) \times f(\text{Hz}) \leq P(\text{Torr}) \leq 500(\text{Torr})$ where f(Hz) is a frequency of high frequency power.

6 Claims, 14 Drawing Sheets

FIG. 3
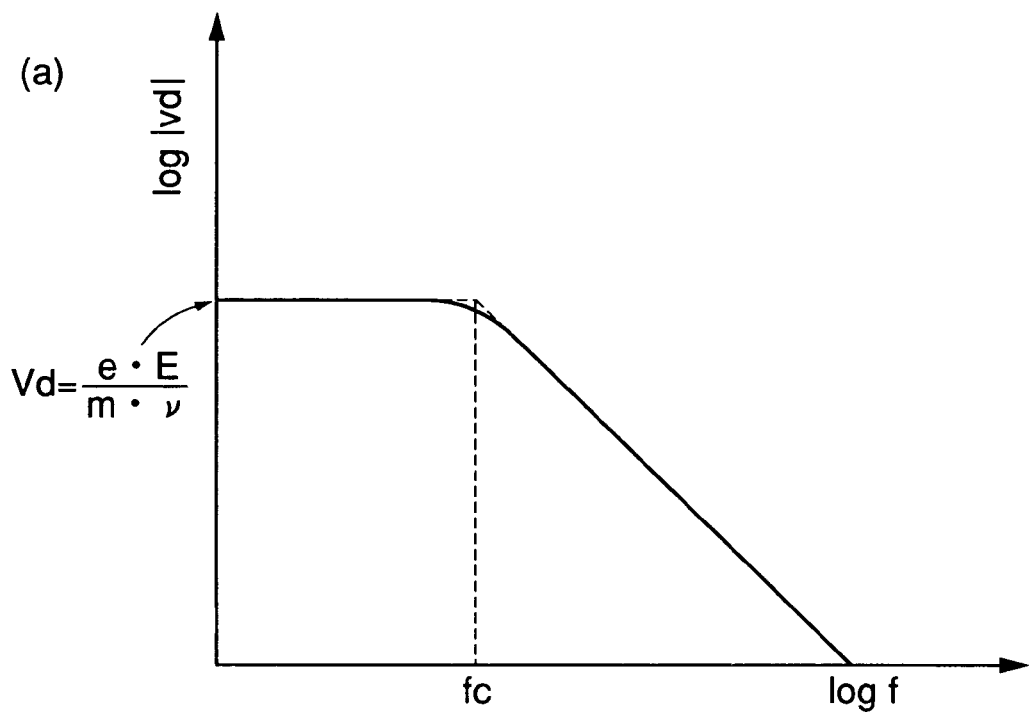
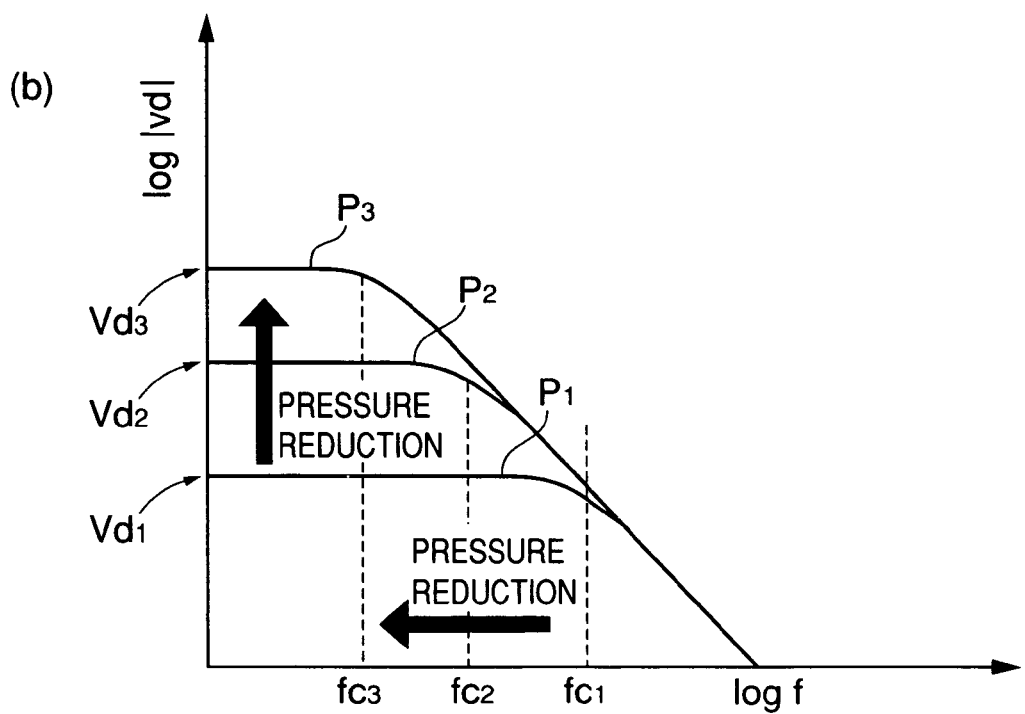

FIG. 6
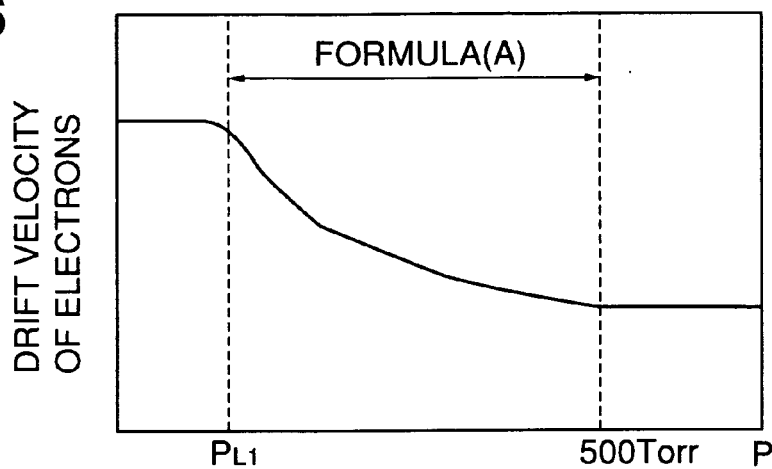
(a)
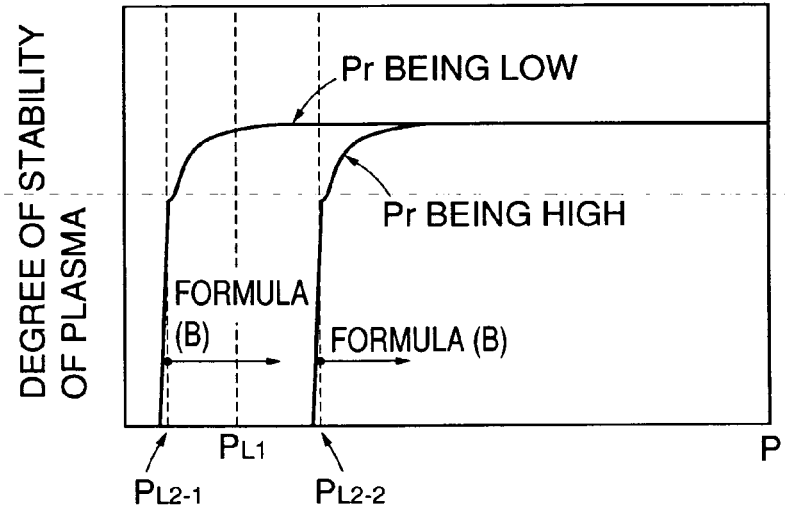
(b)
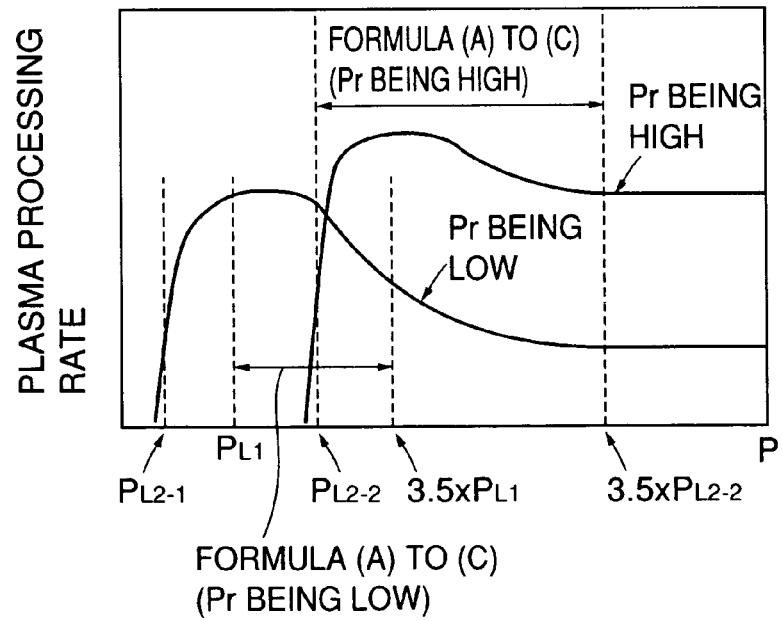
(c)

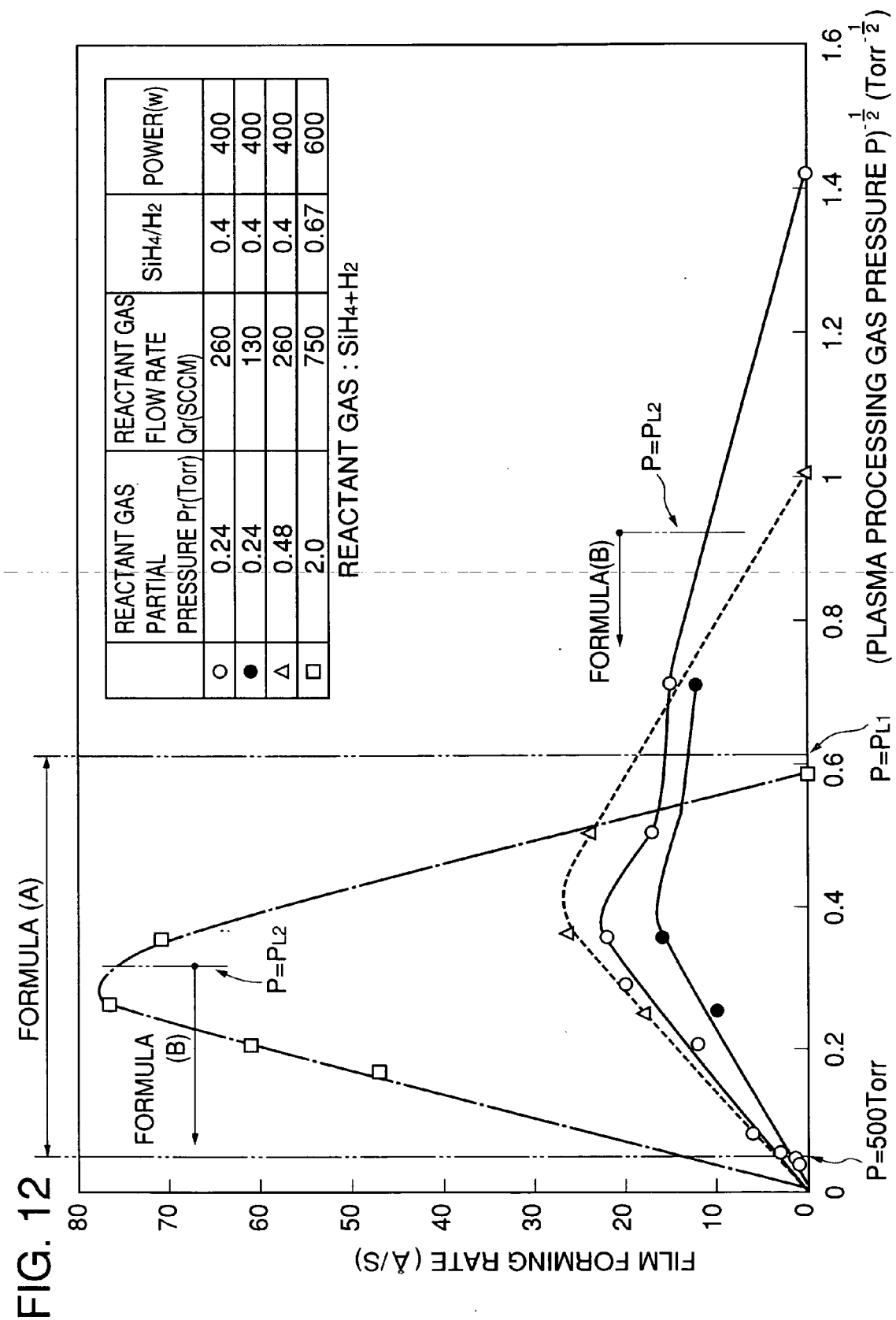

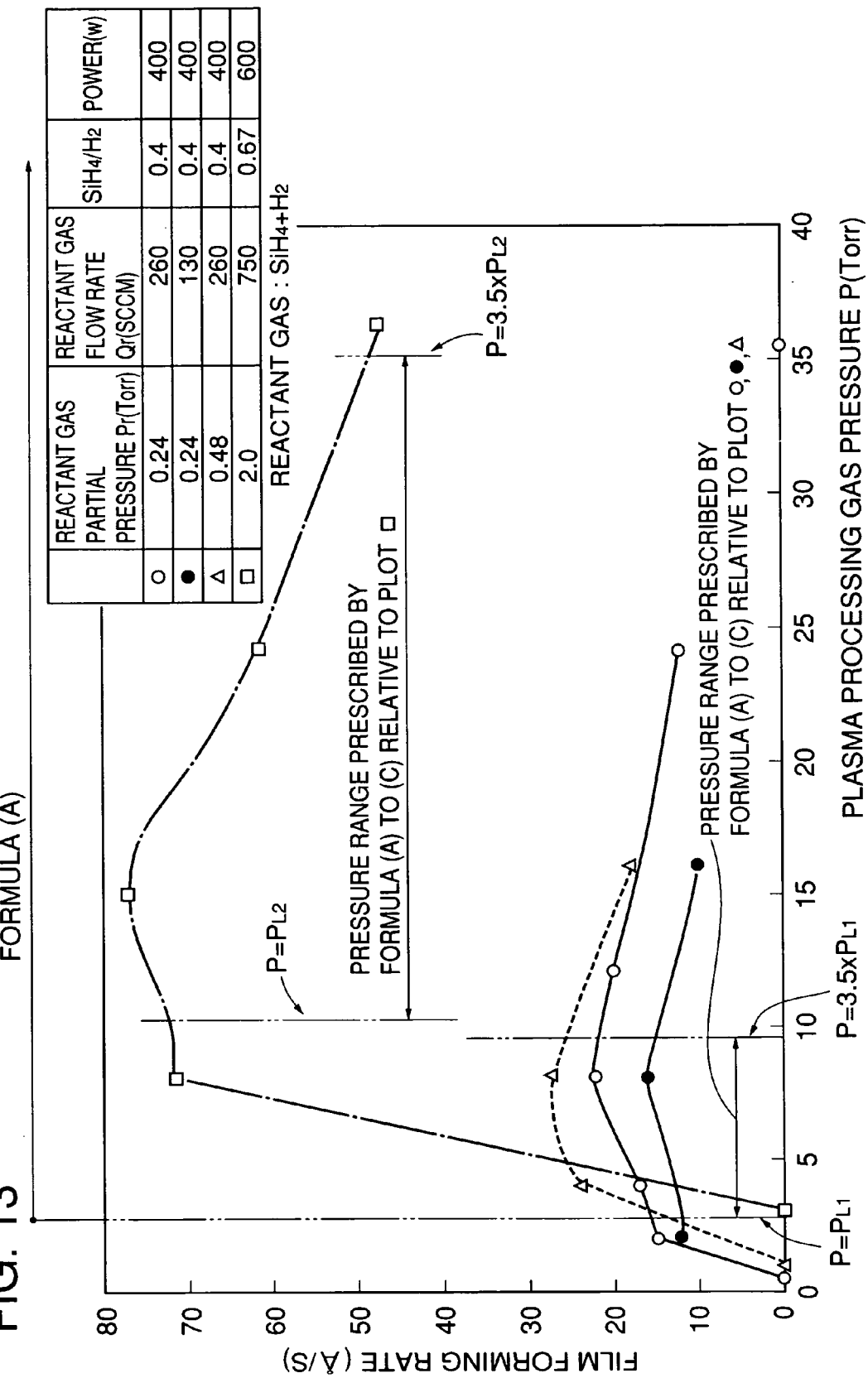

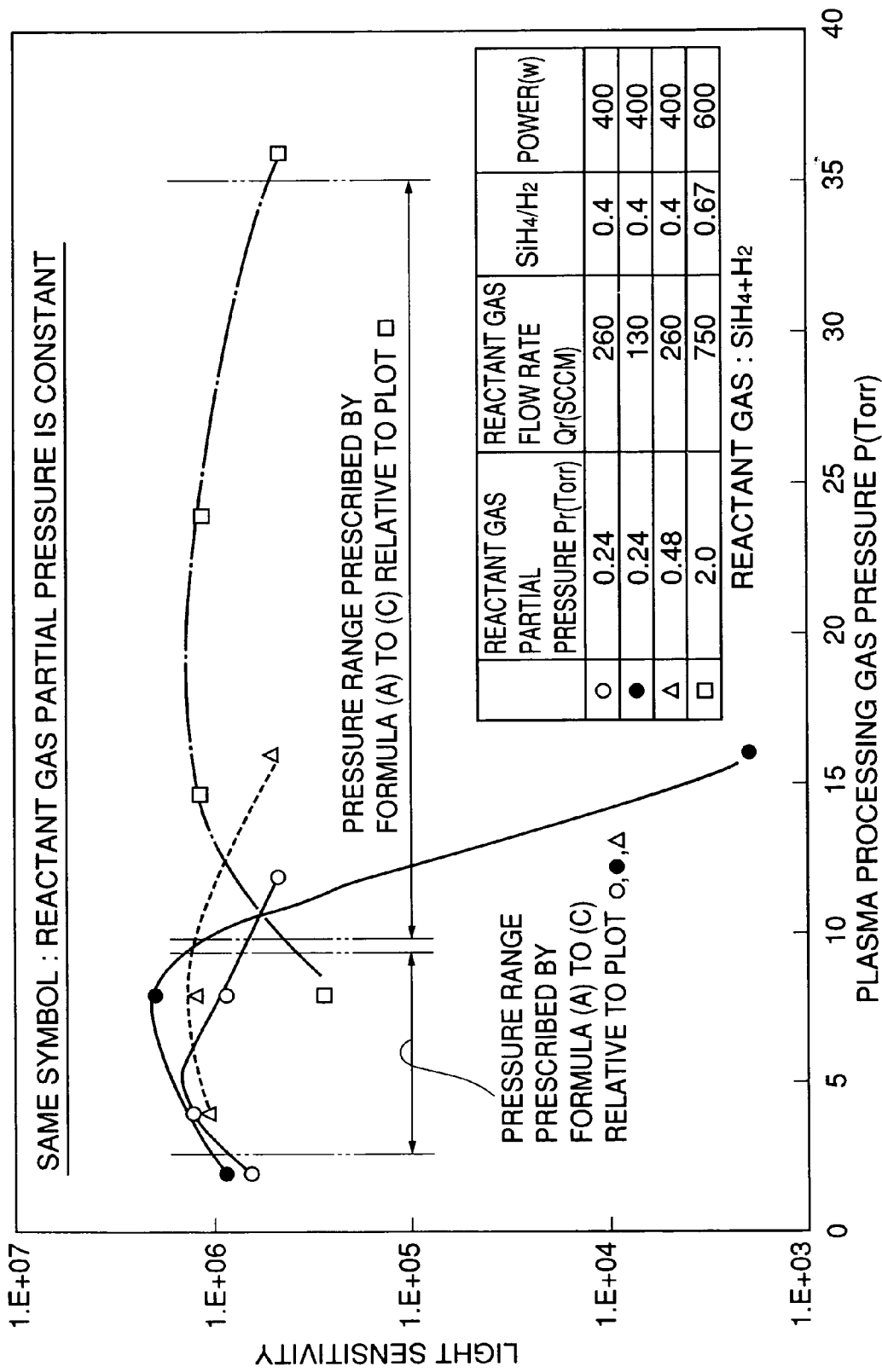

PLASMA PROCESSING METHOD

CROSS-REFERENCE TO RELATED APPLICATION

This application is related to Japanese patent application No. Hei 11(1999)-096859 filed on Apr. 2, 1999, whose priority is claimed under 35 USC §119. the disclosure of which is incorporated herein by reference in its entirety.

BACKGROUND OF THE INVENTION

1. Field of the Invention

The present invention relates to a plasma processing method for performing film formation (deposition), etching, surface treatment on a substrate and the like, and more particularly, to a plasma processing method for generating plasma based on a plasma processing gas to perform film formation (deposition), etching, surface treatment and the like for a thin film such as a semiconductor thin film, an insulating thin film and so on, and in particular specifying a pressure range of a plasma processing gas in association with a cycle of high-frequency power to thereby enable high speed processing.

2. Description of the Related Art

High rate processing has been demanded in a plasma processing for performing film formation (deposition), etching, surface treatment and the like for a thin film such as semiconductor thin film, an insulating thin film and so on. To get high rate of the processing, a technique for raising pressure of a reactant gas is generally employed. However, when the reactant gas is raised in pressure, it becomes difficult to generate plasma stably.

Japanese Patent Publication No. 60412/1994, Japanese Patent Specification No. 2700177, Japanese Patent Laid-Open No. 299358/1994 and so on disclose a technique for generating plasma stably under high pressure by adding an inert gas to a reactant gas. With these publications, a large amount of inert gas is added to a reactant gas, so that plasma can be maintained stably and the processing speed can be enhanced even when the reactant gas is raised in partial pressure.

The three publications described above are common in a fundamental thought that an inert gas is added to a reactant gas, and plasma processing is performed under high pressure.

Hereupon, contents disclosed in Japanese Patent Specification No. 2700177 will be described as an example with reference to FIG. 4. The publication relates to a thin film forming (deposition) method, of which fundamental thought is common to an etching method, and a surface treatment.

In FIG. 4, the reference numeral 1 designates a reaction vessel. The reference numerals 2, 3 designate opposed electrodes, to either of which high resistance bodies 4, 5 are mounted. The electrode 3 is grounded, and a substrate 6 is loaded on the high resistance body 5 on the electrode 3. The electrode 2 is connected to a high frequency power source 8. Provided laterally of the electrodes 2, 3 are a nozzle 7 and a gas outlet 10 so that a gas is supplied to a gap portion g between the upper high resistance body 4 and the substrate 6. In addition, the substrate 6 is heated by a heater 9 when a thin film is to be formed.

With the above arrangement, a plasma processing gas composed of a mixture gas of a reactant gas and a He gas is introduced into the reaction vessel 1 from the nozzle 7, and a high frequency power is supplied to the electrode 2. When an amorphous thin film Si is to be formed on the substrate 6, a $SiH_4$ gas is used as the reactant gas. Pressure of the plasma processing gas is near the atmospheric pressure, and a percentage of the He gas in the plasma processing gas is 90% or more. The high frequency power has a frequency of 13.56 MHz. The above technique is used to cause glow discharge in the gap g, so that plasma is produced based on the plasma processing gas. Plasma of the $SiH_4$ gas, a reactant gas, is used to form the amorphous thin film Si on the substrate 6. According to the above technique, because the percentage of the He gas is great, glow discharge is generated even under high pressure near the atmospheric pressure, enabling to maintain plasma stably. The above publication describes the following actions as actions of the He gas.

(a) He is liable to be excited by electric discharge.

(b) He has many quasi-stable states, and many active particles (radicals) of He in excited condition can be formed in plasma.

(c) When active particles (radicals) of He are present in high density, dissociation of a reactant gas can be enhanced.

(d) Ion is liable to diffuse in He plasma, and so discharge is liable to spread.

Such properties of the He gas enable maintaining plasma stably even in the condition that the reactant gas is high in partial pressure. Besides, because the reactant gas is high in partial pressure, it is possible to increase a processing rate for plasma processing.

Also, because pressure of the plasma processing gas is near the atmospheric pressure, it is unnecessary to evacuate an interior of the reaction vessel for vacuum. Accordingly, there is no need of a vacuum chamber and a vacuum exhausting apparatus, and so cost required for installation can be much decreased.

With the above prior technique, an inert gas is added to the reactant gas, so that plasma can be maintained stably even when the reactant gas is increased in partial pressure. So, because the reactant gas is high in partial pressure, it is possible to increase a processing rate for plasma processing. In plasma processing in recent years, however, the demand for increasing a processing rate is very strict, as typified by the manufacturing process for amorphous Si solar cells. That is, it is desired to enhance the processing rate further. With respect to improvement of the processing rate, the prior art teaches the following matters.

(1) Japanese Patent Specification No. 2700177

With respect to the case where a plasma processing gas composed of a mixture gas of a reactant gas ($SiH_4$ gas) and an inert gas (He gas) has a pressure near the atmospheric pressure, it is shown that the processing rate is raised by increasing a ratio of the reactant gas to the inert gas. By the way, increasing the ratio of the reactant gas under a condition that the plasma processing gas (mixture gas) is constant in pressure corresponds to increasing the reactant gas in partial pressure.

(2) Japanese Patent Laid-Open No. 299358/1994

It is shown that a processing rate is increased by raising a reactant gas in partial pressure (not less than 10 Torr) and correspondingly adding an inert gas. It is prescribed that pressure of a plasma processing gas is 10.2 Torr to 100 Torr, and such pressure range indicates a limit for generation of plasma with only a reactant gas, and a limit for low temperature plasma. That is, a pressure range determined in terms of increasing the processing rate is not shown.

(3) Japanese Patent Publication No. 60412/1994

A ratio of an inert gas in a plasma processing gas (mixture gas) is prescribed in terms of stability on discharge under the atmospheric pressure, but nothing is shown with respect to increasing a processing rate.

As described above, the prior arts show improvement of a processing rate by increasing a reactant gas in partial pressure. However, the publications do not present any guideline for increasing the processing rate for a constant partial pressure of the reactant gas. That is, the publications do not teach the matter as to "under a condition that the reactant gas is constant in partial pressure, how much inert gas should be added, and what pressure of a plasma processing gas (mixture gas) should be set so as to be effective in increasing the processing rate".

Meanwhile, to aim at greatly increasing the processing rate, it is very important to enhance an efficiency of use of a reactant gas for a constant partial pressure of the reactant gas to thereby increase the processing rate.

According to the disclosure of Japanese Patent Publication No. 60412/1994 and Japanese Patent Specification No. 2700177, it is unnecessary to evacuate an interior of a reaction vessel, because a plasma processing gas composed of a mixture gas of a reactant gas and an inert gas has a pressure near the atmospheric pressure. Therefore, there is no need of a vacuum chamber and a vacuum exhausting apparatus, and so cost required for installation can be much decreased. However, even if being not evacuated, an interior of the reaction vessel must be filled with a mixture gas of a reactant gas and an inert gas at 1 atmospheric pressure. That is, if the plasma processing gas (mixture gas) is high in pressure, it is necessary to introduce into the reaction vessel a correspondingly large amount of the plasma processing gas (mixture gas). In particular, the He gas used in large amount is expensive, and so a ratio of cost required for the He gas becomes great taking account of cost per device in mass-production factories. According to the above-described prior art, while cost required for installation can be decreased, cost required for consumable goods such as He gas increases, which leads to high cost, judging comprehensively.

SUMMARY OF THE INVENTION

A first object of the present invention is to achieve a substantial increase in a processing rate in a plasma processing. The present invention aims at an increase in a processing rate under the condition that load power is constant and a reactant gas is constant in partial pressure.

A second object of the present invention is to provide a plasma processing on a semiconductor device which can achieve a decrease in cost while increasing a processing rate in a plasma processing. The present invention has been thought for solving the above problems.

There is provided a plasma processing method for performing film formation (deposition), etching, surface treatment or the like on a substrate by supplying high frequency power between an electrode and a holder, by which the substrate is supported to be opposed to the electrodes, to generate plasma between the electrodes and the substrate on the basis of a plasma processing gas, wherein pressure P(Torr) of the plasma processing gas is set to satisfy the following relationship $$P_{L1}=2\times 10^{-7}(Torr/Hz)\times f(Hz) \leq P(Torr) \leq 500(Torr)$$

where f(Hz) is a frequency of the high frequency power.

That is, the present invention specifies a pressure range of the plasma processing gas used in association with a cycle of high-frequency power to thereby provide an increase in a processing rate and reduction in cost under the condition that the high-frequency power is constant and a reactant gas is constant in partial pressure.

BRIEF DESCRIPTION OF THE DRAWINGS

FIG. 3 is a view illustrating the reason why a lower limit is set for a plasma processing gas pressure in the present invention (a view illustrating the relationship of drift velocity of electrodes with a frequency of high frequency power).

FIG. 6 is a schematic view illustrating the meaning of a plasma processing gas pressure P, (a) showing a relationship between the gas pressure P and a drift velocity of electrons in plasma, (b) representing a relationship between the gas pressure P and a degree of plasma stability in an imaged manner, and (c) showing a relationship between the gas pressure P and a plasma processing rate.

FIG. 12 is a graph obtained by rewriting the graph of FIG. 8 with $(-0.5)$ power of the plasma processing gas pressure P being indicated on an axis of abscissas.

FIG. 13 is a graph showing the addition of pressure ranges, prescribed by the formulae (A), (B) and (C), to a graph similar to that in FIG. 8.

FIG. 14 is photo sensitivity of a Si thin film manufactured under the conditions shown in FIG. 13, plotted relative to a plasma processing gas pressure P.

DETAILED DESCRIPTION OF THE PREFERRED EMBODIMENT

Figure 1:
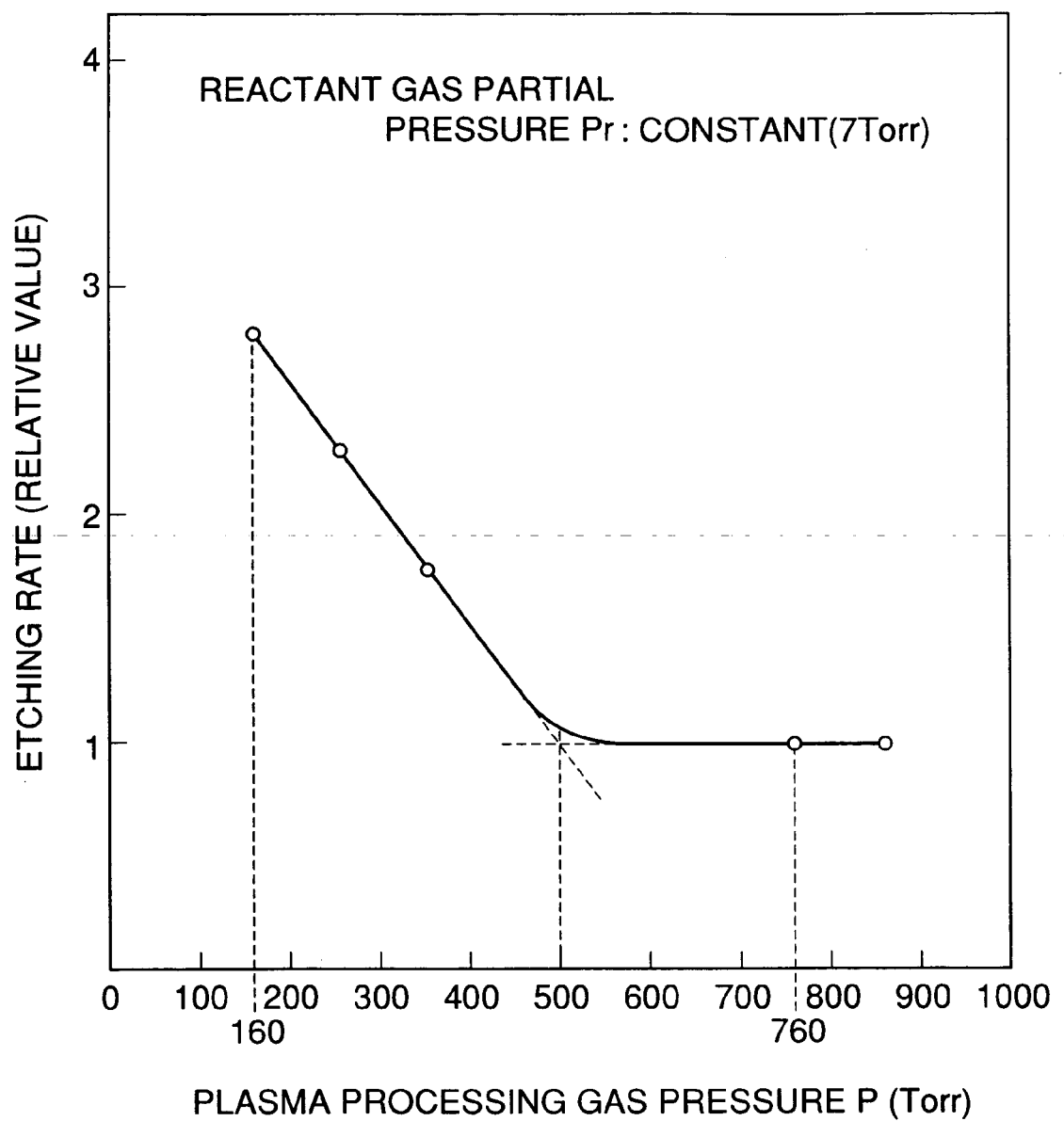
FIG. 1 is a view illustrating the reason why an upper limit is set for a plasma processing gas pressure in a plasma processing method according to the present invention (a view illustrating dependency of an etching rate on a plasma processing gas pressure).

The present invention provides a plasma processing method for performing film formation (deposition), etching, surface treatment or the like on a substrate by supplying high frequency power between an electrode and a holder, by which the substrate is supported to be opposed to the electrode, to generate plasma between the electrode and the substrate on the basis of a plasma processing gas, wherein pressure P(Torr) of the plasma processing gas is set to satisfy the following relationship $$2 \times 10^{-7}(Torr/Hz) \times f(Hz) \leq P(Torr) \leq 500(Torr)$$

where f(Hz) is a frequency of the high frequency power.

The plasma processing gas of the present invention may be a mixture gas of a reactant gas and an inert gas.

The pressure P(Torr) of the plasma processing gas may be set to a pressure near a lower limit of a pressure range in which the above relationship is satisfied and the plasma can be maintained stable.

And, the pressure P (Torr) of the plasma processing gas may be set to satisfy the following relationship $$5 \times Pr(Torr) \leq P(Torr)$$

where Pr (Torr) is a partial pressure of the reactant gas.

Furthermore, the pressure P (Torr) of the plasma processing gas may be set to satisfy the following relationship $$P(Torr) \leq 3.5 \times P_L(Torr)$$

where the pressure $P_L$(Torr) is a higher one of a pressure represented by a relationship $$P_L(Torr) = 5 \times Pr(Torr)$$

and a pressure represented by a relationship $$P_L(Torr) = 2 \times 10^{-7}(Torr/Hz) \times f(Hz)$$

where f(Hz) is a frequency of the high frequency power and Pr(Torr) is a partial pressure of the reactant gas.

In the present invention, since a high processing rate can be obtained in consideration of suppression on damage to a substrate due to collision of charged particles, prevention of unnecessary discharge, and scale of equipment, it is preferable that a frequency f(Hz) of high frequency power supplied to the electrode is 10 MHz or more, and 500 MHz or less, and a pressure P of the plasma processing gas is 100 Torr or more, and 500 Torr or less.

In the present invention, a He gas, an Ar gas, a Ne gas or the like is used as a simple substance or mixed with one another to provide for an inert gas. However, taking account of stability in discharge and suppression on damage to a substrate, it is desirable to use a He gas. Meanwhile, a gas conformed to the purpose of plasma processing is used for the reactant gas. For example, in the case of forming amorphous, microcrystal and polycrystal of Si thin film, a gas containing Si atoms such as $SiH_4$, $Si_2H_6$ or the like is used in the form of a simple substance or mixed with other gases such as $H_2$ or the like to be used. In the case of plasma etching of a Si base substrate, a halogen base gas such as $SF_6$, $CF_4$, $C_2F_6$, $C_3F_8$, $CCl_4$, $PCl_3$ and the like is used in the form of a simple substance or mixed with other gases such as $O_2$ or the like to be used. In the case of surface treatment of hydrophilicity, an organic solution such as alcohol group is used.

The plasma processing method of the present invention can be preferably applied for film formation (deposition), etching, surface preparation and the like, especially for formation of a thin film such as a semiconductor thin film, an insulating thin film and so on.

As described above, first object of the present invention is to achieve a further increase in a processing rate in a plasma processing method, in which a plasma processing gas composed of a mixture gas of a reactant gas and an inert gas is used. It is well known that the processing rate is increased by increasing a high-frequency power and raising a reactant gas in partial pressure. Accordingly, to achieve a substantial increase in a processing rate as compared with the prior art, it is important to enhance an efficiency of use of high-frequency energy and a reactant gas, under the condition that high-frequency power is constant and the reactant gas is constant in partial pressure, to generate reactive species of high density to thereby increase the processing rate. This thought is represented in image configuration by the following formula.

$$Rate = \eta \times F(W, P_r)$$

Here, Rate indicates a processing rate, $\eta$ an efficiency, W high-frequency power, $P_r$ partial pressure of the reactant gas, and $F(W, P_r)$ a function of $W, P_r$. It is well known that $F(W, P_r)$ is made large by increasing W and $P_r$, resulting in an improvement in Rate. In particular, the three prior documents disclose that $P_r$ is increased and $F(W, P_r)$ is increased by adding an inert gas to the reactant gas. This is clearly shown in FIG. 2 of Japanese Patent Laid-Open No. 299358/1994.

In addition thereto, the present invention aims at increasing the efficiency $\eta$, and is quite different from the prior art in fundamental guideline for improvement of a processing rate.

That is, the present invention aims at increasing a processing rate (Rate) under the condition that high-frequency power (W) is constant and the reactant gas is constant in partial pressure ($P_r$).

To achieve an increase in a processing rate under the condition that high-frequency power W is constant and the reactant gas is constant in partial pressure Pr, the inventors of the present invention have noticed a pressure P of a plasma processing gas, (partial pressure Pi of an inert gas in a plasma processing gas) and in particular found that the processing rate decrease even when an inert gas is too much, thus completing the present invention.

In addition, used in the following description are "reactant gas partial pressure Pr", "inert gas partial pressure Pi", "plasma processing gas pressure P", "reactant gas concentration Cr", "inert gas concentration Ci", "reactant gas flow rate Qr", "inert gas flow rate Qi", "total flow rate Q", and "chamber base total flow rate Qc". Correlations among the above are defined in the following formulae. Here, "chamber base total flow rate Qc" indicates a flow rate under the condition "plasma processing gas pressure P", and does not indicate a flow rate in atmospheric pressure base.

[plasma processing gas pressure $P(Torr)$]=[inert gas partial pressure $Pi(Torr)$]+[reactant gas partial pressure $Pr(Torr)$]     (b)

[reactant gas concentration $Cr$]=[reactant gas partial pressure $Pr(Torr)$]/[plasma processing gas pressure $P(Torr)$]

=[reactant gas flow rate $Qr(SCCM)$]/[total flow rate $Q(SCCM)$]     (c)

[inert gas concentration $Ci$]=[inert gas partial pressure $Pi(Torr)$]/[plasma processing gas pressure $P(Torr)$]=[inert gas flow rate $Qi(SCCM)$]/[total flow rate $Q(SCCM)$]     (d)

[total flow rate $Q(SCCM)$]=[inert gas flow rate $Qi(SCCM)$]+[reactant gas flow rate $Qr(SCCM)$]     (e)

[chamber base total flow rate $Qc(cc/min)$]=[total flow rate $Q(SCCM)] \times [760(Torr)]$/[plasma processing gas pressure $P(Torr)$]     (f)

In addition, reactant gas flow rate Qr is represented as follows from the above formulae (c), (f).

[reactant gas flow rate $Qr(SCCM)$]=[reactant gas concentration $Cr$]×[chamber base total flow rate $Qc$(cc/min)]× [plasma processing gas pressure $P(Torr)$]/[760$(Torr)$]=[reactant gas partial pressure $Pr(Torr)$]

×[chamber base total flow rate $Qc$(cc/min)]/[760 $(Torr)$]    (g)

Points aimed at by the present invention will be described hereinbelow.

While overlapping an explanation regarding the prior art, an effect by the addition of an inert gas to a reactant gas will be first explained. The most preferable inert gas is believed to be a He gas, an example of an effect produced by the He gas includes a low discharge start voltage and a quasi-stable condition at high energy (about 20 eV). In addition, He radicals in the quasi-stable condition have long life time and large diffusion velocity. The addition of He gas having such nature can keep plasma stable even at a high reactant gas partial pressure Pr and a high plasma processing gas pressure P.

As described above, a He gas is essential in keeping plasma stable at high pressures (increased reactant gas partial pressure). However, the presence of He gas in large amount is not necessarily desirable in terms of processing rate. This is a point aimed at by the present invention.

Here, consideration is taken of the case where a partial pressure of He gas Pi is made low (plasma processing gas pressure P is made low) assuming that high-frequency power is constant and a reactant gas (Pr) is constant in partial pressure. In this case, the following is presumed.

(1) Corresponding to the low He gas partial pressure Pi, He radicals in the quasi-stable condition decrease in density, and the number of collisions of He radicals and reactant gas molecules per unit time decreases, so that the reactant gas molecules become hard to decompose. As a result, reactive species concerned with plasma processing decrease in density and so the processing rate becomes small.

(2) Corresponding to the plasma processing gas pressure P being low, electrons in plasma become great in drift velocity due to an electric field. Since the reactant gas partial pressure Pr, that is, the density of the reactant gas molecules is constant, the number of collisions of electrons and reactant gas molecules per unit time increases with an increase in drift velocity. Further, kinetic energy possessed by electrons is great at this time. Therefore, the reactant gas molecules are promoted in decomposing. As a result, reactive species concerned with plasma processing increase in density and so the processing rate increases.

Actually, it is presumed that the above phenomena act in compound manner, and assuming that the processing rate has some dependence on He gas partial pressure Pi (plasma processing gas pressure P), experiments have been performed to confirm the assumption.

Then the result of the experiments has been analyzed, and it has been found that the above factor (2) is dominantly contributory.

More specifically, while the He gas is essential in keeping plasma stable at increased reactant gas partial pressure Pr, it is not so much effective in decomposing reactant gas molecules. In view of this, it is desired that under the condition of constant reactant gas partial pressure Pr, the He gas be added so as to enable keeping plasma stable, and the plasma processing gas pressure P be set to as low as possible in a range, in which electrons are increased in drift velocity. Accordingly, electrons are increased in drift velocity, and reactant gas molecules are efficiently decomposed. So, it is possible to increase an efficiency of use of high-frequency energy and the reactant gas to enhance the processing rate.

The present invention has been completed on the basis of the above-advanced analysis, and is prescribed in the following manner. More specifically, in a plasma processing method, in which a plasma processing gas composed of a mixture gas of a reactant gas and an inert gas is used, a plasma processing gas pressure P(Torr) is set with respect to a frequency f(Hz) of high frequency power supplied to an electrode in a manner to satisfy the following relationship.

$P_{L1}=2\times10^{-7}(Torr/Hz)\times f(Hz) \leq P(Torr) \leq 500(Torr)$    (A)

Thus the high rate of plasma processing is achieved by setting plasma processing gas pressure P to a low level (setting the inert gas partial pressure Pi to a low level) in the range, in which the above formula (A) is satisfied, and plasma can be kept stable.

Preferably, a plasma processing gas pressure P(Torr) is in the range prescribed by the above formula (A) and prescribed relative to a reactant gas partial pressure Pr(Torr) by the following relationship.

$P(Torr) \leq 5\times Pr(Torr) = P_{L2}$    (B)

More preferably, a plasma processing gas pressure P(Torr) is in the range prescribed by the above formula (A) and prescribed relative to a pressure $P_L(Torr)$ by the following relationship.

$P(Torr) \leq 3.5\times P_L(Torr)$    (C)

In the formula (C), the pressure $P_L(Torr)$ is a higher one of a pressure $P_{L1}(Torr)$ represented by the formula (D) and a pressure $P_{L2}(Torr)$ represented by the formula (E), relative to a frequency f(Hz) of high frequency power and a reactant gas partial pressure Pr(Torr).

$P_L(Torr)=P_{L1}(Torr)=2\times10^{-7}(Torr/Hz)\times f(Hz)$    (D)

$P_L(Torr)=P_{L2}(Torr)=5\times Pr(Torr)$    (E)

In addition, preferably, the above frequency is 10 MHz or more, and 500 MHz or less, and a plasma processing gas pressure P is 100 Torr or more, and 500 Torr or less. More preferably, a He gas is used as an inert gas.

Figure 4:
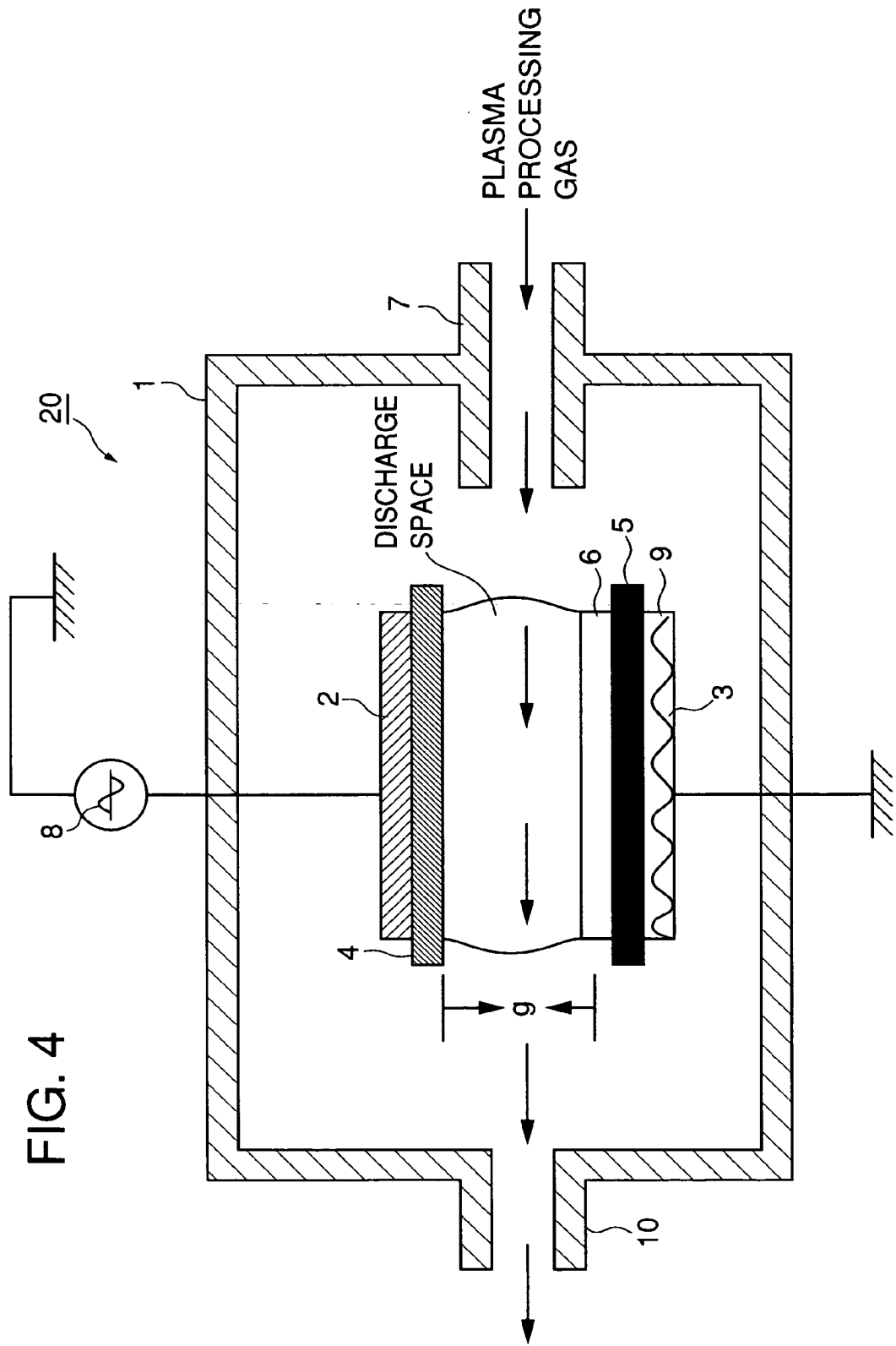
FIG. 4 is a view schematically illustrating a plasma processing apparatus used in the prior art and in the present invention.

(II) Embodiments of the present invention bases on the above fundamental thought will be described with reference to FIGS. 1 to 5. An apparatus for performing plasma processing only requires a configuration to generate plasma between an electrode and a substrate, and is not specifically limitative. However, it is desirable that the apparatus be constructed to efficiently supply a gas to a discharge space and efficiently exhaust a gas after plasma reaction because a processing rate for plasma processing is high. For example, a similar construction to the plasma processing apparatus shown in FIG. 4 is employed. Here, the plasma processing method according to the present invention will be described with reference to FIG. 4.

In addition, according to the present invention, a reaction vessel 1 in a plasma processing apparatus 20 can be maintained at a degree of vacuum on the order of at least several Torr or less. Also, there is an evacuation device (not shown). A heater 9 is used in accordance with a configuration of intended plasma processing, as needed. High resistance bodies 4, 5 are provided to prevent arc discharge and to obtain a stable glow discharge but may be suitably removed in the case where a stable glow discharge can be obtained when they are not provided or only either of them is provided. Other constructions are the same as described with respect to the prior art, and so are omitted. In addition, an electrode 3 shown in FIG. 4 corresponds to a holder recited in the claims.

An interior of the reaction vessel 1 is once reduced in pressure by an evacuation device (not shown). Thereafter, a plasma processing gas composed of a mixture gas of a reactant gas and an inert gas is introduced into the interior of the reaction vessel 1 from a nozzle 7 to keep a plasma processing gas pressure P in the interior of the reaction vessel at a predetermined pressure based on the above formula (A). Then, while keeping the predetermined plasma processing gas pressure P, the nozzle 7 and a gas outlet 10 form a gas stream of constant flow rate in a gap g between the high resistance body 4 and the substrate 6. A size of the gap g is on the order of 0.1 to 10 mm, and a chamber base total flow rate Qc of the plasma processing gas is on the order of several hundreds CC/min to several hundreds L/min. With such arrangement, when high frequency power is supplied to the electrode 2, glow discharge is produced in the gap g to generate plasma based on the plasma processing gas. Then, plasma of a reactant gas in the plasma processing gas applies desired plasma processing on the substrate 6.

In the present invention, a He gas, an Ar gas and a Ne gas, respectively, are singly used or mixed with one another to be used as an inert gas. However, it is desirable to use a He gas in view of stability in discharge and suppression of damages on the substrate. Meanwhile, a gas intended for the plasma processing is used for a reactant gas. For example, in the case of forming amorphous, microcrystal and polycrystal of Si thin film, a gas containing Si atoms such as $SiH_4$, $Si_2H_6$ or the like is used in the form of a simple substance or mixed with other gases such as $H_2$ or the like to be used. In the case of plasma etching of a Si base substrate, a halogen base gas such as $SF_6$, $CF_4$, $C_2F_6$, $C_3F_8$, $CCl_4$, $PCl_3$ and the like is used in the form of a simple substance or mixed with other gases such as $O_2$ or the like to be used. In the case of surface treatment of hydrophilicity, an organic solution such as alcohol group is used.

Pressure P(Torr) of a plasma processing gas composed of a mixture gas of a reactant gas and an inert gas is set to satisfy the following relationship to a frequency f(Hz) of high frequency power supplied to the electrode 2.

$$P_{L1}=2\times10^{-7}(Torr/Hz)\times f(Hz) \leq P(Torr) \leq 500(Torr) \quad (A)$$

Preferably, a plasma processing gas pressure P(Torr) is set to a low level, which is in the range prescribed by the above formula (A) and permits plasma to be maintained stably.

Concretely, a plasma processing gas pressure P(Torr) is in the range prescribed by the above formula (A) and prescribed relative to a reactant gas partial pressure Pr(Torr) by the following relationship.

$$P(Torr) \leq 5\times Pr(Torr) = P_{L2} \quad (B)$$

Also, a plasma processing gas pressure P(Torr) is in the range prescribed by the above formula (A) and prescribed relative to a pressure $P_L$(Torr) by the following relationship.

$$P(Torr) \leq 3.5\times P_L(Torr) \quad (C)$$

In the formula (C), the pressure $P_L$(Torr) is a higher one of a pressure $P_{L1}$(Torr) represented by the formula (D) and a pressure $P_{L2}$(Torr) represented by the formula (E), relative to a frequency f(Hz) of high frequency power and a reactant gas partial pressure Pr(Torr).

$$P_L(Torr)=P_{L1}(Torr)=2\times10^{-7}(Torr/Hz)\times f(Hz) \quad (D)$$

$$P_L(Torr)=P_{L2}(Torr)=5\times Pr(Torr) \quad (E)$$

A reactant gas partial pressure Pr(Torr) is in the range of the plasma processing gas pressure P(Torr) prescribed by the above formula (A) and set to enhance the processing rate to the best. While depending upon a kind of the reactant gas, the partial pressure is appropriate to be in the range of 0.01 to 20 Torr. Preferably, a reactant gas partial pressure Pr(Torr) is set together with a plasma processing gas pressure P(Torr) so as to meet the relationships (A) to (C).

The meaning of the plasma processing gas pressure P(Torr) prescribed by the above formulae (A) to (C) will be described with reference to FIG. 6. Besides, experimental results and the reason for limitations on the pressure range prescribed above will be described in details in connection with embodiments described later.

FIG. 6(*a*) is a schematic view showing a relationship between a plasma processing gas pressure P and a drift velocity of electrons in plasma. As shown in the figure, a range prescribed in the formula (A) indicates one, in which a plasma processing gas pressure P is decreased to thereby increase a drift velocity of electrons. That is, there is the possibility that the drift velocity will not increase below $P_{L1}$, even when the pressure P is reduced. Also, at and above $P_{L1}$, the drift velocity is substantially proportional to the pressure P to the minus one-half power ($P^{-0.5}$), but the degree of increase of the drift velocity when the pressure P is reduced is very small at a pressure of 500 Torr or higher. As described later, since a plasma processing rate increases in proportion to an increase in drift velocity of electrons, under the condition that a reactant gas partial pressure Pr is constant, it is desired that a plasma processing gas pressure P be at a level, which is in the range prescribed by the above formula (A) and as low as possible.

In the case where a reactant gas partial pressure Pr is high, however, plasma cannot be maintained stable unless a large amount of an inert gas is added to correspond to the reactant gas partial pressure Pr. More specifically, plasma cannot be sometimes maintained stable with a pressure $P_{L1}$ shown in FIG. 6(*a*). FIG. 6(*b*) is a view showing a relationship between a plasma processing gas pressure P and a degree of plasma stability in an imaged manner. In the case where a reactant gas partial pressure Pr is low, stable plasma is obtainable at a pressure $P_{L2-1}$ lower than a lower limit pressure $P_{L1}$ shown in FIG. 6(*a*). In the case where a reactant gas partial pressure Pr is high, however, stable plasma cannot be obtained unless the plasma processing gas pressure P is larger than $P_{L2-2}$, which is larger than $P_{L1}$. A range of pressure (at least $P_{L2-1}$ or at least $P_{L2-2}$), in which plasma can be maintained stable, is prescribed by the above formula (B).

On the basis of correlation between drift velocity of electrons shown in FIG. 6(*a*) and a degree of plasma stability shown in FIG. 6(*b*), a relationship between a plasma processing gas pressure P and a plasma processing rate is represented schematically as shown in FIG. 6(*c*). More specifically, in the case where a reactant gas partial pressure Pr is low, a plasma processing rate reaches a peak when a plasma processing gas pressure P is at least and near $P_{L1}$. Also, in the case where a reactant gas partial pressure Pr is high, a plasma processing rate reaches a peak when a plasma processing gas pressure P is at least and near $P_{L2-2}$. A plasma processing gas pressure P when a plasma processing rate reaches a peak is present in the range prescribed by the above formulae (A) to (C).

More preferably, a frequency f(Hz) of the above-mentioned high frequency power is 10 MHz or more, and 500 MHz or less, and a plasma processing gas pressure is set to 100 Torr or more, and 500 Torr or less on the basis of the formula (A). In addition, the lower limit pressure of 100 Torr is one which surely satisfies the formula (A) under the condition of f(Hz)≦500 MHz. However the pressure is desirably hot lower than 100 Torr in consideration of a scale of an installation such as an evacuation device or the like.

Here, 10 MHz is a frequency used for general plasma processing apparatuses of low pressure. In the present invention, however, because plasma is generated under the condition that a reactant gas partial pressure Pr is increased and a plasma processing gas pressure P is a relationship high pressure, the gap g between the electrode 2 (high resistance body 4) and the substrate 6 is as small as 0.1 to 10 mm. Accordingly, damages on the substrate 6 must be suppressed by increasing the frequency above 10 MHz and reducing amplitude of vibration of ions and electrons. This is indicated by a formula (22) described later. Meanwhile, increasing the frequency too much causes the wavelength of electromagnetic wave to be reduced. Especially when electromagnetic wave will have a wavelength of 0.6 m or less at and above 500 MHz, there is the possibility that standing waves are generated in optional spaces within the reaction vessel to produce unnecessary discharge in antinode portions thereof. Therefore, a frequency of 500 MHz or less is selected.

The present invention entails the addition of an inert gas to a reactant gas like the prior art to thereby enable maintaining plasma stable even when a reactant gas partial pressure Pr is raised. Further, since a reactant gas partial pressure Pr is high, it is possible to enhance a processing rate for plasma processing. In this manner, an inert gas is essential for the purpose of maintaining plasma stable under high pressures. However, the inventors of the present application have found that the processing rate is decreased rather when an inert gas is too much.

In the present invention, pressure P(Torr) of a plasma processing gas composed of a mixture gas of a reactant gas and an inert gas is set relative to a constant reactant gas partial pressure Pr in a manner to satisfy the formula (A). Then, in such pressure range and in the range, in which plasma can be maintained stable, by setting a plasma processing gas pressure P to a low level (by setting an inert gas partial pressure Pi to a low level) the processing rate is greatly enhanced.

Concretely, a He gas is added in an amount, which can maintain plasma stable, under the condition that high-frequency power is constant and a reactant gas partial pressure Pr(Torr) is constant, and a plasma processing gas pressure is set in the range, in which the formula (A) or the formulae (A) to (C) are satisfied. By the way, a chamber base total flow rate Qc(cc/min) is constant, then a reactant gas flow rate Qr(SCCM) is also constant based on the formula (g). As a result, the processing rate is greatly enhanced as compared with the case where a plasma processing gas pressure P is near the atmospheric pressure, although a reactant gas partial pressure Pr is the same. Thus, an improvement can be achieved in efficiency of use of high-frequency energy and a reactant gas, whereby the first object of the present invention can be attained.

Further, according to the present invention, because a plasma processing gas pressure is 500 Torr or less in spite of an increased processing rate for plasma processing, an inert gas introduced into the reaction vessel may be small in amount as compared with the case where the plasma processing gas pressure is 1 atmospheric pressure. Thus cost for an inert gas can be reduced to attain the second object of the present invention.

The reason for the limitation on a plasma processing gas pressure P indicated by the formula (A) will be described below on the basis of embodiments. In addition, the limitation on pressures prescribed by the formulae (B), (C) will be described in connection with "second embodiment". As described in the preceding description of the specification, assuming that the processing rate has some tendency to rely upon a He gas partial pressure Pi (a plasma processing gas pressure P), an experiment has been performed to confirm this.

A He gas was used as an inert gas, and an apparatus shown in FIG. 4 was used to carry out a plasma processing experiment. Here, He radicals in a quasi-stable condition had a high energy of about 20 eV. Meanwhile, a major part of molecules of reactant gases used for general plasma processing has a bonding energy between atoms, which is much smaller than 20 eV. For example, Si—H bonding in $SiH_4$ molecules, S—F bonding in $SF_6$ molecules, and H—H bonding in $H_2$ molecules all have energy on the order of 3 to 4 eV. Accordingly, it is thought that a tendency for decomposition of reactant gas molecules to depend on a He gas partial pressure Pi is the same for any reactant gas. However, a processing rate for plasma processing depends on not only the decomposing process of reactant gas molecules but also on the conveying process of reactive species after decomposition and the chemical reaction process, so that the processing rate is not necessarily increased by efficient decomposition of a reactant gas. However, the fundamental process for increasing the processing rate inherently consists of the decomposition process of a reactant gas, and it is important that a reactant gas is efficiently decomposed in such process to generate reactive species of high density. The present invention places a principal point on this matter, and so is not concerned with the configuration of plasma processing and a type of a reactant gas.

If plasma processing is varied in configuration, it suffices to suitably set conditions, such as a gas flow velocity and a substrate temperature, for making effective use of reactive species depending upon the reactive species generated. That is, a plasma processing gas pressure P desired for any reactant gas and plasma processing of any configuration is in the range prescribed in the present invention. Hereupon, $SF_6$ gas as an example of a reactant gas was used in the experiment to investigate a change in a decomposition effect of a reactant gas relative to a change in the He gas partial pressure Pi. In addition, the reason for selection of $SF_6$ gas first is that the gas is a typical insulating gas and a high need exists for the use of a He gas for maintaining plasma under high pressures. $SF_6$ gas has a difficulty in maintaining plasma but is not different from other reactant gases in investigating an action of decomposition due to a He gas. This is proved by the experimental results (second embodiment), in which a mixture gas of $SiH_4$ gas and $H_2$ gas was used as a reactant gas.

An explanation is given to a concrete method of experiment. A change in etching rate for silicon substrates was investigated with high-frequency power (1 kW) and a $SF_6$ gas partial pressure $Pr_2$ (7 Torr) being constant and a plasma processing gas pressure P (He gas partial pressure Pi) being varied. In addition, other conditions than the He gas partial pressure Pi were the same and a chamber base total flow rate Qc was constant, so that a reactant gas flow rate Qr was also constant based on the formula (g). Further, a frequency of high frequency power was 50 MHz.

The experimental results as shown in FIG. 1 reveal that when a plasma processing gas pressure P was at most 500 Torr with a critical point being 500 Torr, the lower the pressure, the higher an etching rate. That is, the plasma processing gas pressure P was at most 500 Torr, whereby the decomposition of a $SF_6$ was efficiently promoted, and the etching rate was increased. For example, under the condition of the pressure being 160 Torr, an increase in the etching rate was achieved to be approximately three times under the condition of the pressure being 760 Torr although high-frequency power, a reactant gas partial pressure Pr and a reactant gas flow rate Qr were the same. Thus, high-frequency power and a reactant gas were greatly enhanced in efficiency of use.

Based on the above results, an upper limit of the plasma processing gas pressure in the present invention was prescribed to be 500 Torr.

By the way, since the reactant gas partial pressure Pr was constant and the plasma processing gas pressure P was low, it may be misunderstood that the above results were due to an effect of an increase in a reactant gas concentration Cr based on the formula (c). However, as understood from the following analysis, the processing rate was actually enhanced by decreasing the plasma processing gas pressure P. In connection with this, the inventors of the present application have obtained experimental facts shown in FIG. 5.

Figure 5:
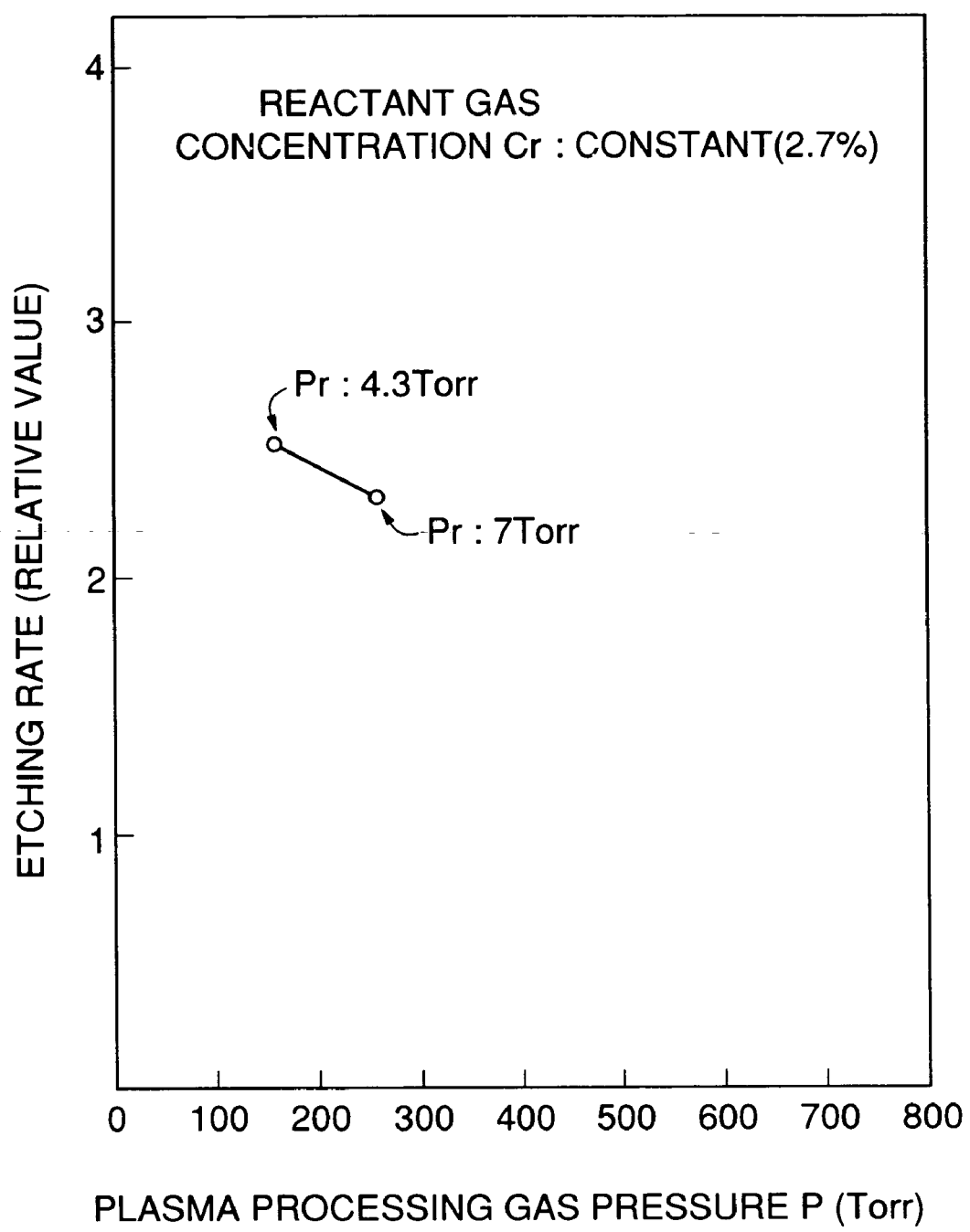
FIG. 5 is a graph showing results obtained by investigating the dependency of an etching rate on a plasma processing gas pressure with high-frequency power and a reactant gas concentration being constant.

FIG. 5 is a graph showing results obtained by investigating the dependency of an etching rate on a plasma processing gas pressure P with high-freqyency power (1 kW) and a reactant gas concentration Cr (2.7%) being constant. Although the reactant gas concentration Cr is constant (or a reactant gas partial pressure Pr is low), the etching rate is increased by decreasing the plasma processing gas pressure P.

Further, the above experimental results were analyzed to reveal that the processing rate for plasma processing is closely correlated to drift velocity of electrons.

Figure 2:
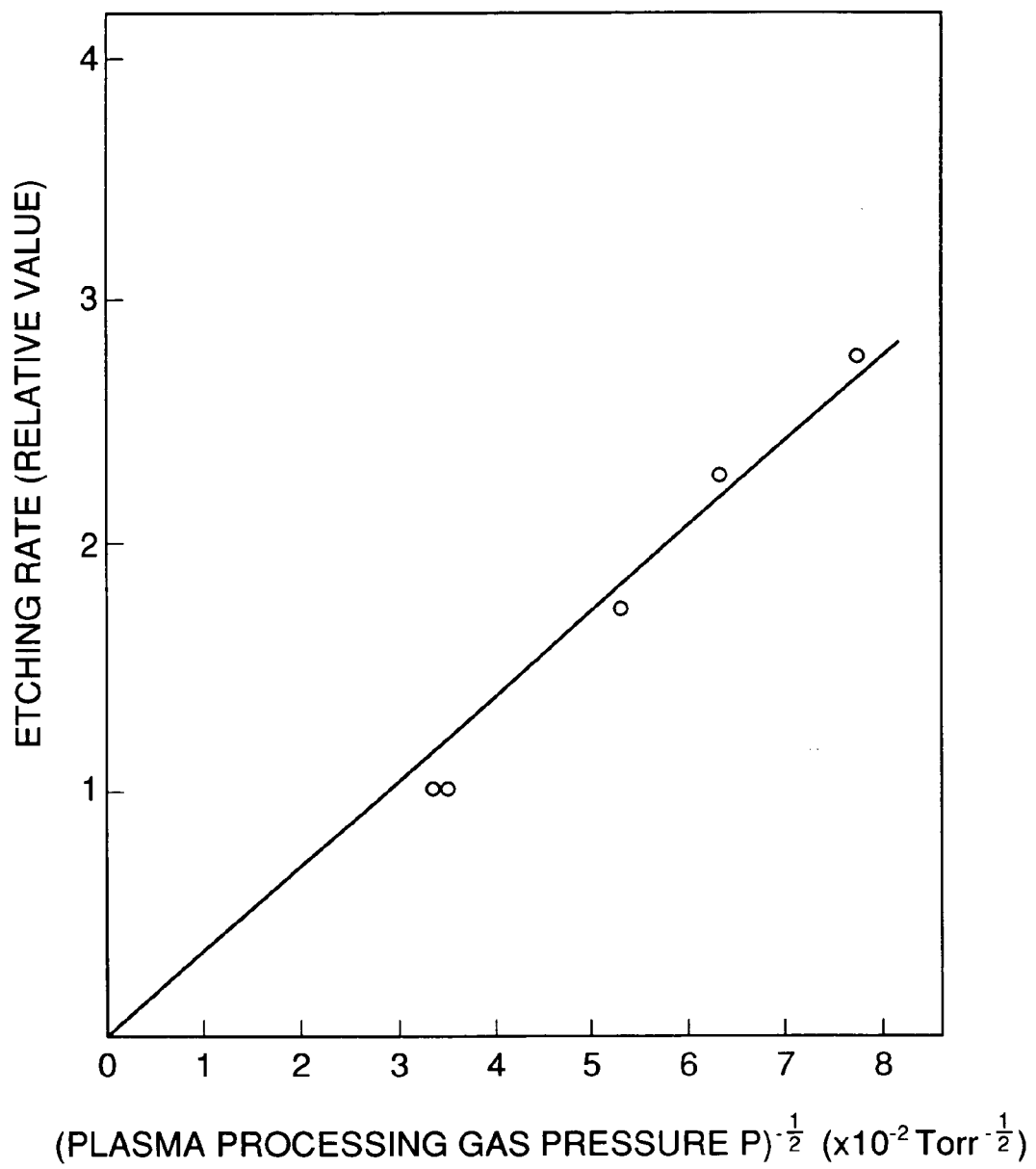
FIG. 2 is a view illustrating a correlation between the function of the present invention and drift velocity of electrons (a view illustrating the relationship of an etching rate with $(-\frac{1}{2})$ power of a plasma processing gas pressure).

FIG. 2 is obtained by rewriting a graph of FIG. 1 with a plasma processing gas pressure P to the minus one-half power ($P^{-0.5}$) plotted in abscissas. As seen from the figure, the etching rate is substantially proportional to a plasma processing gas pressure P to the minus one-half power ($P^{-0.5}$). Correspondingly, drift velocity of electrons is theoretically proportional to a plasma processing gas pressure P to the minus one-half power ($P^{-0.5}$), as shown in the formula (20) described later.

From the above analysis, it is seen that the etching rate increases with an increase in drift velocity of electrons. That is, it is presumed that decomposition of a reactant gas is affected and governed by collision of electrons with molecules of a reactant gas, rather than collision of He radicals with molecules of a reactant gas. Accordingly, when a He gas partial pressure Pi (plasma processing gas pressure P) is decreased under the condition of a reactant gas partial pressure Pr being constant, drift velocity of electrons increases, and the number of collisions of electrons with reactant gas molecules per unit time increases, whereby decomposition of a reactant gas is promoted. Thereby, the processing rate is increased. Meanwhile, He radicals posses high energy, but are large in mass and are not accelerated by electric field. Therefore, the number of collisions of He radicals with reactant gas molecules is less than that electrons.

That is, a He gas is essential for the purpose of maintaining plasma stable, but does not have so much effect on decomposition of a reactant gas molecules. From the above, it is desired that a He gas be added in an amount, which can maintain plasma stable, under the condition that a reactant gas partial pressure Pr is constant, and a plasma processing gas pressure P be set to 500 Torr or less and as low as possible.

Therefore, drift velocity of electrons is increased, and molecules of a reactant gas are efficiently decomposed. That is, high-frequency energy and a reactant gas is enhanced in efficiency of use, so that the processing rate is increased.

The ground for the lower limit on a plasma processing gas pressure P will be described hereinbelow.

FIG. 3(a) schematically shows relationships between a frequency f of high frequency power and drift velocity $V_d$ of electrons. An axis of abscissas an an axis of ordinate are represented in logarithm. The meaning of the figure will be described in details in connection with "drift velocity of electrons", and $f_c$ indicates a critical frequency, and at the frequency less than the critical frequency $f_c$, drift velocity of electrons follows a high frequency electric field. Also, FIG. 3(b) shows a change in drift velocity $V_d$ of electrons accompanying a change in a plasma processing gas pressure P. In the figure, $f_{c1}$, $f_{c2}$, $f_{c3}$ indicate critical frequencies, respectively, when the plasma processing gas pressure is $P_1$, $P_2$, $P_3$. These pressures are related to one another in a manner shown by $P_1 > P_2 > P_3$, while the critical frequencies are related to one another in a manner shown by $f_{c1} > f_{c2} > f_{c3}$.

Referring to FIG. 3(b), consideration is taken of the case where a frequency f of high frequency power equals to f ($f = f_{c2}$).

In this case, when the pressure is decreased as $P_1 \rightarrow P_2$, the drift velocity is increased as $V_{d1} \rightarrow V_{d2}$.

Even when the pressure is decreased as $P_2 \rightarrow P_3$, however, the drift velocity is not varied. Meanwhile, the present invention makes use of, as analyzed above, an increase in drift velocity, caused by decreasing the plasma processing gas pressure P. Accordingly, it is required that the plasma processing gas pressure be $P_2$ or higher for a frequency $f = f_{c2}$. Generalizing and formalizing the requirement, the plasma processing gas pressure P(Torr) required for a frequency f(Hz) of high frequency power is represented by the following formula (F). This will be described in details in connection with the step of deriving the formula (16) described later.

$$P \geq P_{L1} = \{2 \times 10^{-7} (Torr/Hz)\} \cdot f(Hz) \tag{F}$$

Exemplarily, if the frequency f(Hz) is 500 MHz, the formula (F) is satisfied provided that the plasma processing gas pressure is set 100 Torr or higher.

As described above, if the plasma processing gas pressure is in that range, in which the formula (F) is satisfied, the drift velocity is increased by decreasing the plasma processing gas pressure P on the basis of the thought of the present invention. Therefore, the processing rate is increased. On the other hand, even if the plasma processing gas pressure is set to a low level, in which the formula (F) is not satisfied, there is the possibility that the drift velocity is not increased and so the processing rate is not increased. That is, the plasma processing gas pressure is decreased more than required, and so it is not preferable in consideration of a scale of an installation such as an evacuation device or the like. Due to the above reasons, a lower limit for the plasma processing gas pressure is prescribed as in the formula (F).

On the basis of the embodiment, it has been confirmed that the plasma processing rate is closely correlated to the drift velocity of electrons. And, a factor for increasing the drift velocity of electrons by decreasing a plasma processing gas pressure P is prescribed by the formula (A), and results thereof correspond to FIG. 6(a) shown before.

Second Embodiment

In the above first embodiment, the experimental results have been shown, in which $SF_6$ gas first is used as a typical reactant gas. As described above, however, since it is thought that drift velocity of electrons dominantly contributes to the plasma processing rate, it can be estimated that the pressure range (the formula (A)) prescribed for a plasma processing gas is not dependent upon a type of a reactant gas, and is applicable to any reactant gas.

Hereupon, to confirm this, an experiment for forming a Si thin film on a glass substrate was carried out in the present embodiment, with the use of a mixture gas composed of $SiH_4$ and $H_2$ as a reactant gas.

In the present embodiment, an elaborate experiment was carried out at the plasma processing gas pressure P near the lower limit pressure $P_{L1}$ prescribed in the formula (A), and it has been found that further addition of limitations indicated by the formulae (B), (C) to the condition prescribed in the formula (A) is effective in increasing the plasma processing rate.

Also, it has been found in the present embodiment that the plasma processing method according to the present invention is specifically effective for film formation (deposition) method, and offers a thin film of high quality.

An explanation will be given to a concrete experimental method. A change in film forming rate (deposition rate) was investigated by making constant a reactant gas (mixture gas of $SiH_4$ gas and $H_2$ gas) partial pressure Pr and high-frequency power, and varying a plasma processing gas pressure P (He gas partial pressure Pi). In addition, in the experiment, other conditions than the He gas partial pressure Pi were the same and a chamber base total flow rate Qc(cc/min) was constant, so that a reactant gas flow rate Qr(SCCM) was also constant based on the formula (g). Also, a frequency of high frequency power used in the experiment was 13.56 MHz.

Figure 7:
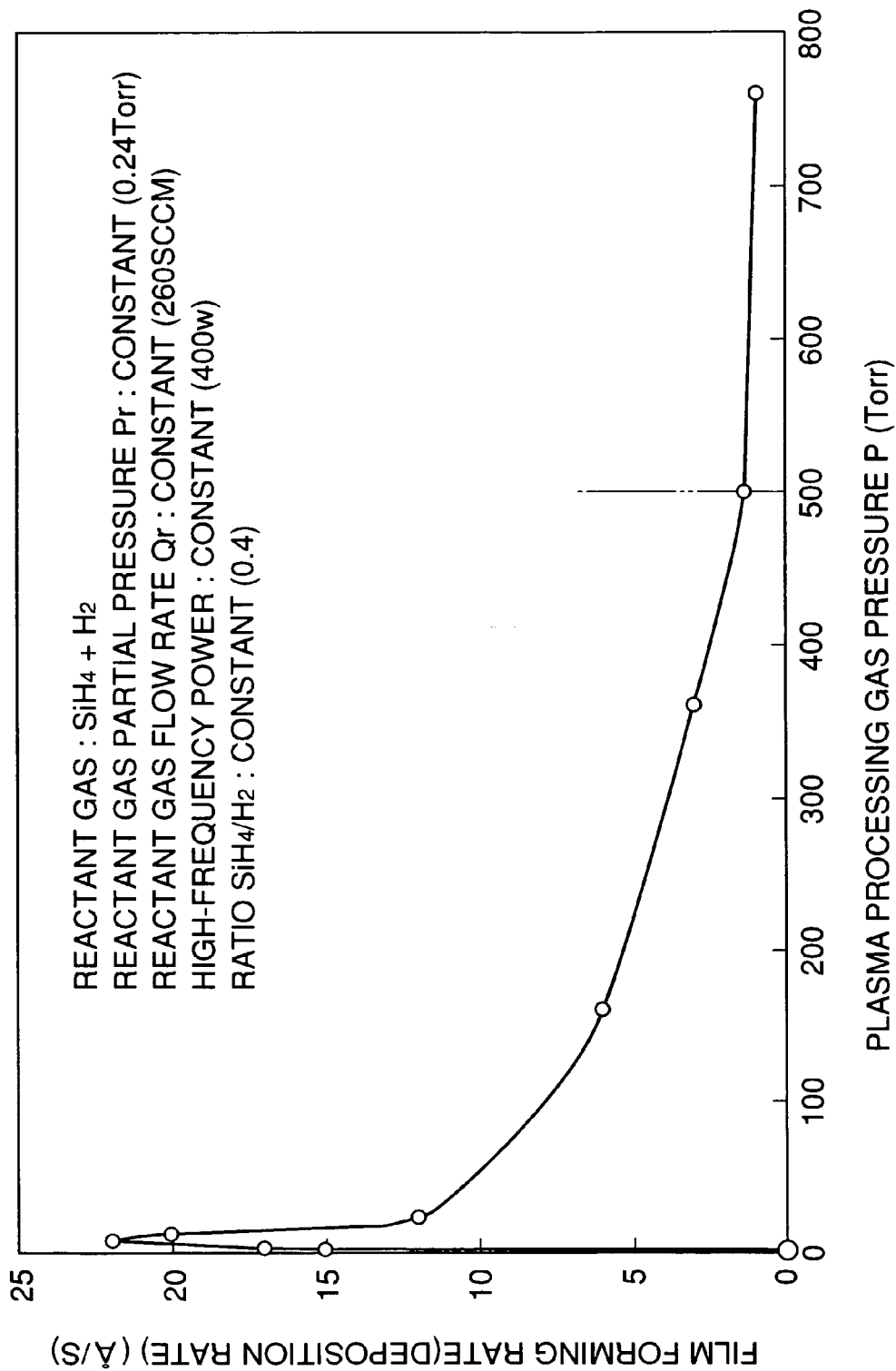
FIG. 7 is a graph showing experimental results in a second embodiment.

Experimental results are shown in FIG. 7, and it was possible to confirm that when a plasma processing gas pressure P was at most 500 Torr with a critical point being 500 Torr, the lower the pressure, the higher the film forming rate (deposition rate) as in the case of etching (FIG. 1).

Figure 8:
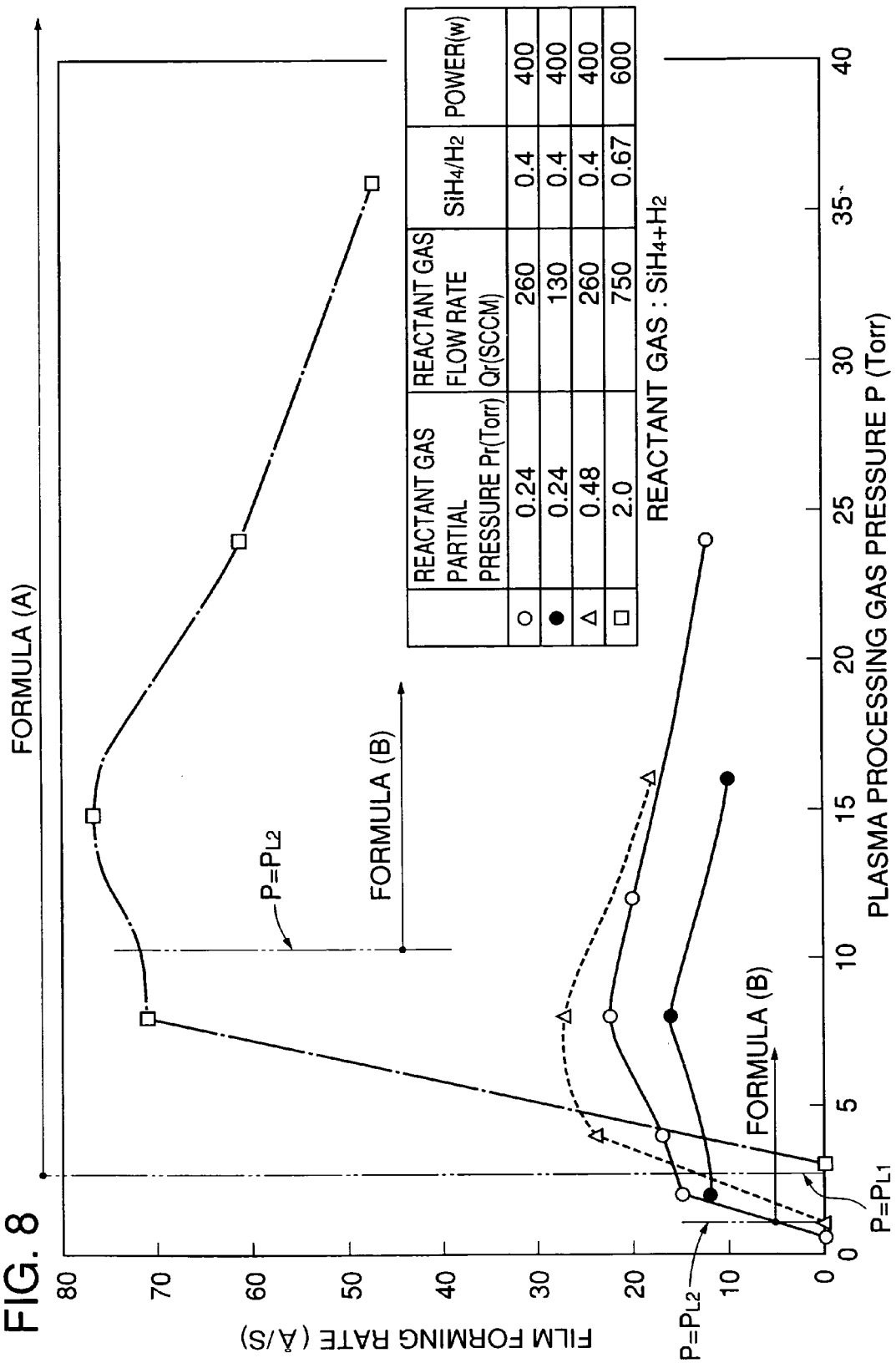
FIG. 8 is a graph showing results of an experiment, which is similar to that in FIG. 7 and carried out under different conditions.
Figure 9:
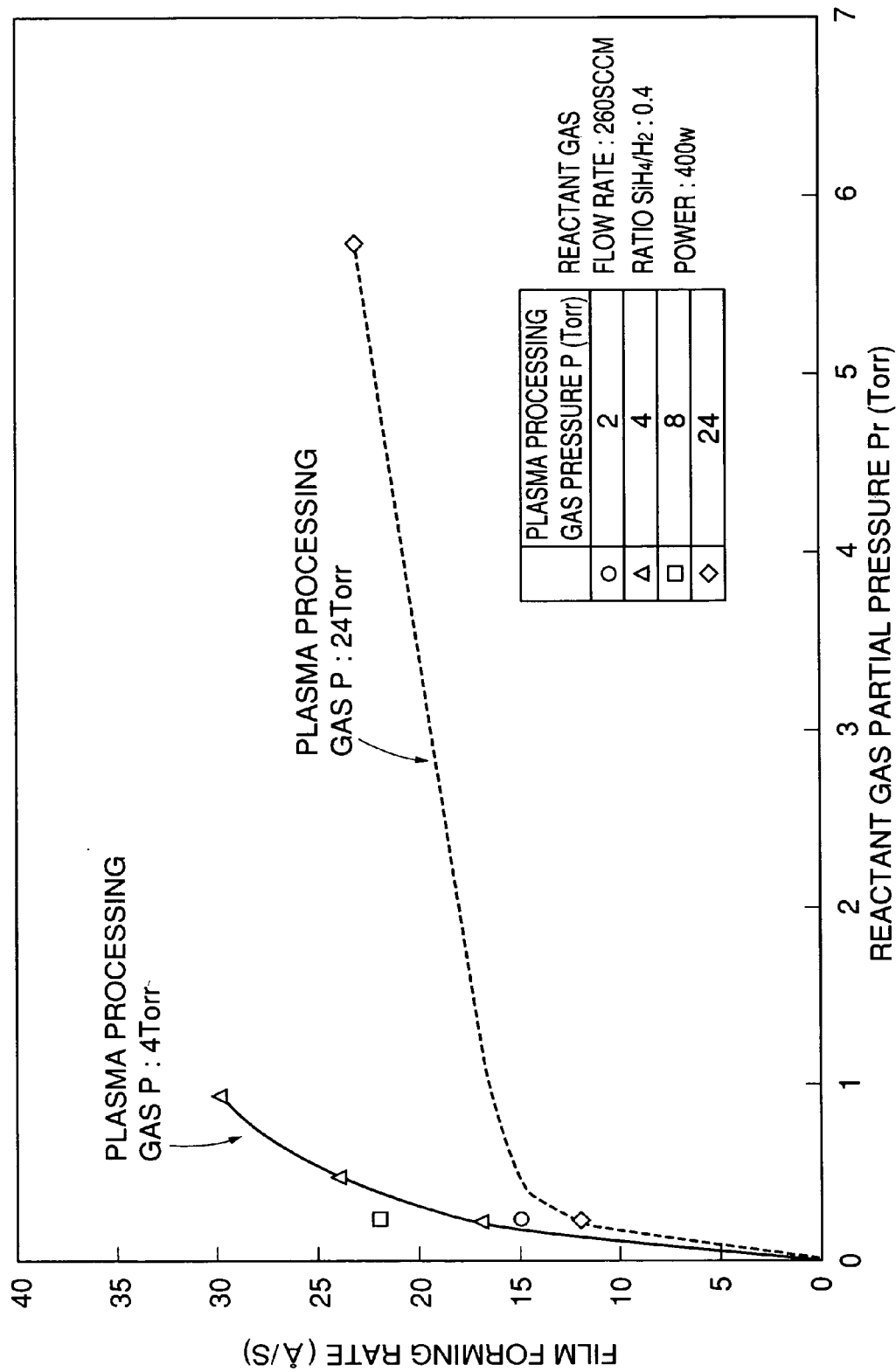
FIG. 9 is a graph illustrating a relationship between a reactant gas partial pressure Pr and a film forming (deposition) rate.

FIG. 8 shows results of an experiment, which is similar to that shown in FIG. 7 and was carried out under four different conditions. FIG. 8 shows results on a lower pressure side, and it was possible to confirm that even if a reactant gas partial pressure Pr, a reactant gas flow rate Qr, high-frequency power and a ratio $SiH_4/H_2$ in the reactant gas are different, a film forming rate (deposition rate) increases as the plasma processing gas pressure P was decreased in the range which is at most 500 Torr. In addition, it can be confirmed from a graph, which is shown in FIG. 9 to indicate a relationship between a reactant gas partial pressure Pr and a film forming rate (deposition rate), that the film forming rate (deposition rate) is increased by reduction in the plasma processing gas pressure even when the reactant gas partial pressure is different.

Figure 10:
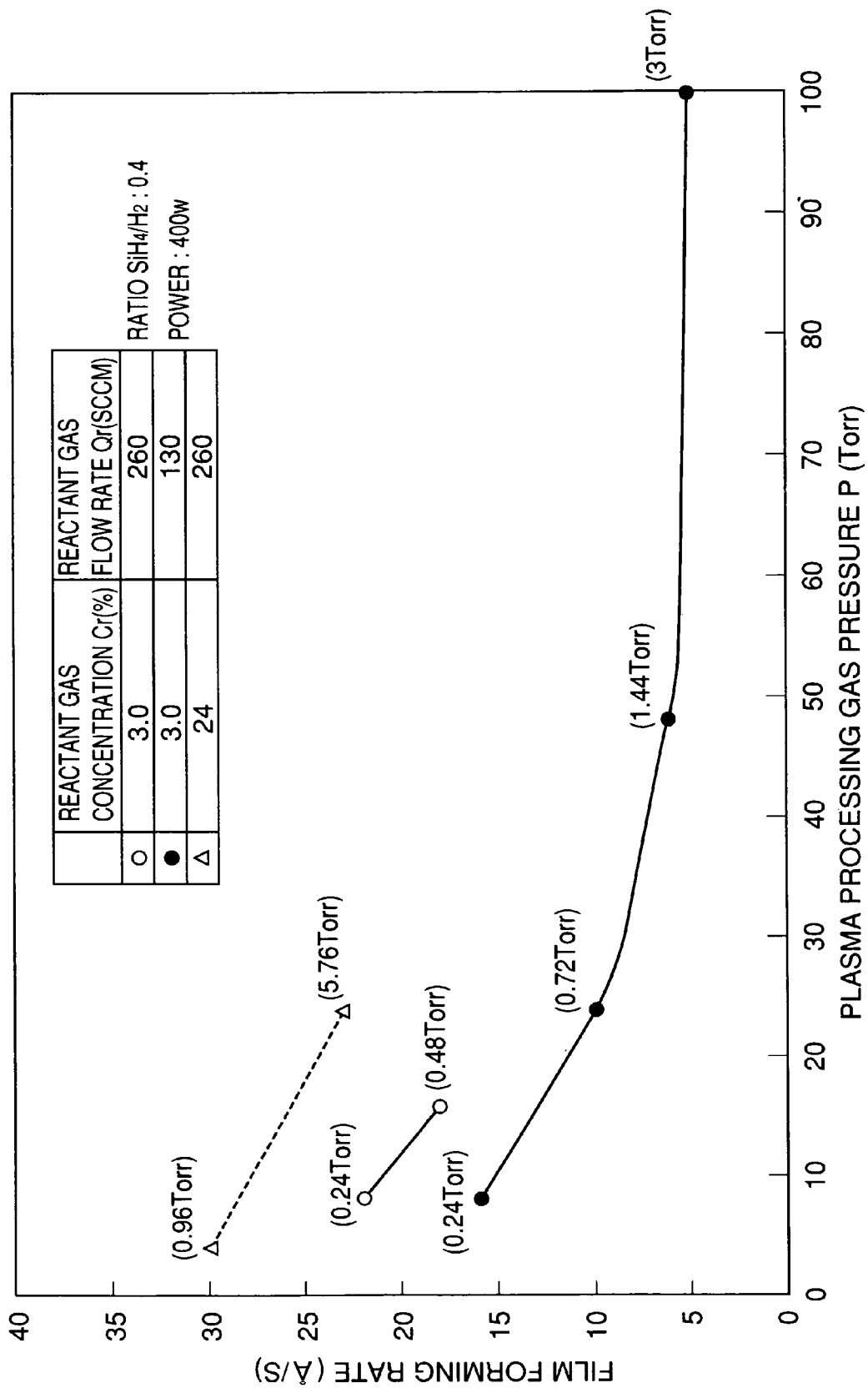
FIG. 10 is a graph illustrating results obtained by investigating the dependency of the film forming (deposition) rate on a plasma processing gas pressure P with high-frequency power and a reactant gas concentration being constant.

Here, the results shown in FIGS. 7 and 8 indicate that the film forming rate (deposition rate) is increased by reducing the plasma processing gas pressure P, but not that an increase in film forming rate (deposition rate) is produced by an increase in a reactant gas concentration Cr. This is apparent from FIG. 10. FIG. 10 shows results obtained by investigating dependency of the film forming rate (deposition rate) on a plasma processing gas pressure P with high-frequency power, a reactant gas concentration Cr and a reactant gas flow rate Qr being constant. The figure shows results under three different conditions, it can be confirmed that although a reactant gas concentration Cr is constant (or a reactant gas partial pressure Pr is low), a film forming rate (deposition rate) is increased by decreasing a plasma processing gas pressure P.

Referring again to FIG. 8, it is shown that the lower limit pressure prescribed by the formula (A) for a plasma processing gas pressure P is indicated by the pressure $P_{L1}$, and the film forming rate (deposition rate) reaches a peak at a higher pressure than the lower limit pressure $P_{L1}$. This result coincides with an image shown in FIG. 6(c), and indicates that at the lower limit pressure $P_{L1}$, plasma is not adequate in stability in some cases. More specifically, reducing the plasma processing gas pressure P under the condition that a reactant gas partial pressure Pr is constant corresponds to reducing the He gas partial pressure Pi, but it becomes difficult to maintain plasma stable when the He gas partial pressure Pi becomes too low.

Figure 11:
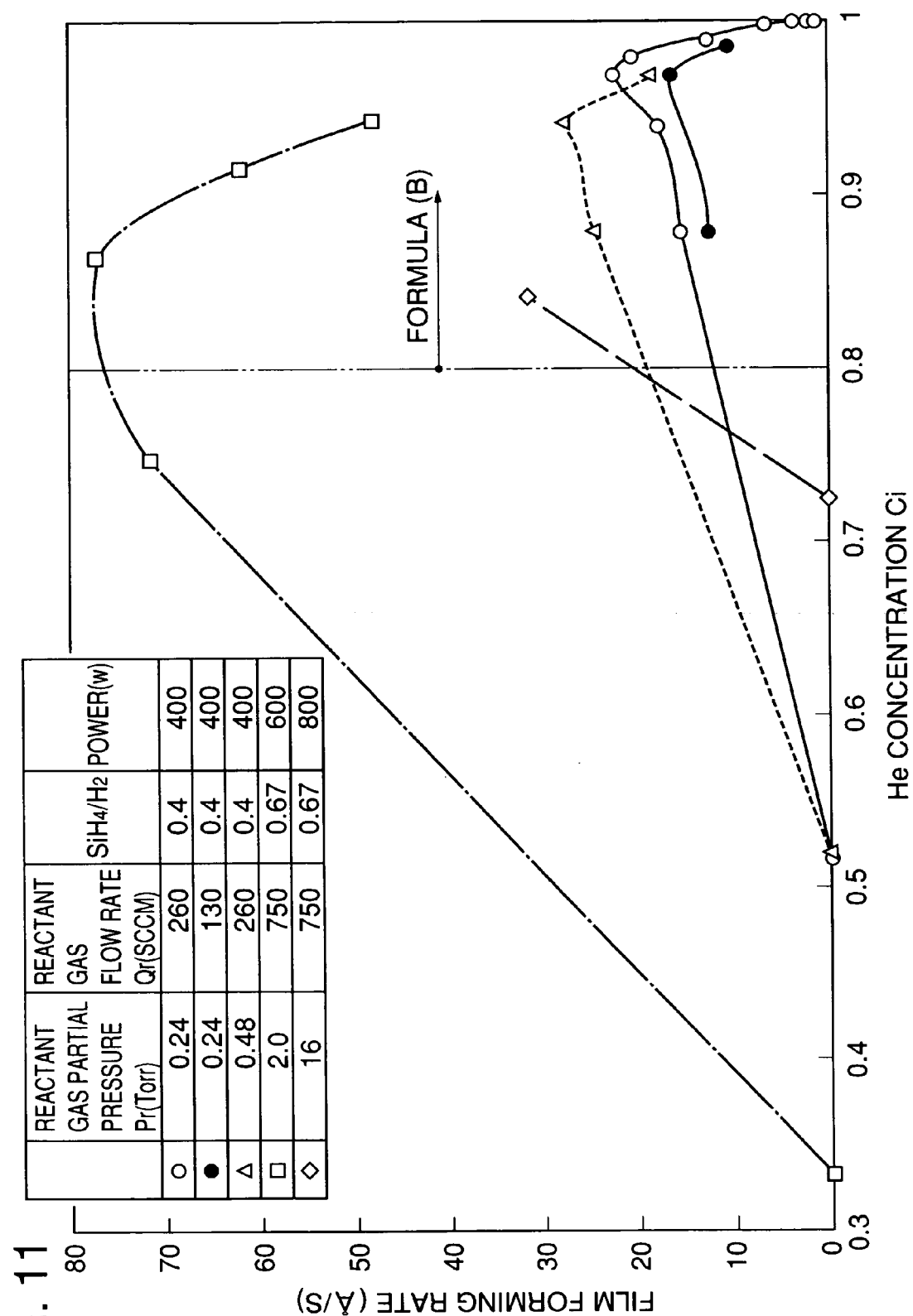
FIG. 11 is a graph obtained primarily by rewriting a graph of FIG. 8 with a He gas concentration Ci being indicated on an axis of abscissas.

In view of this, addition of pressure conditions prescribed by the formula (B) to the formula (A) is preferable, and FIG. 11 shows experimental results, which illustrate this. FIG. 11 is obtained primarily by rewriting a graph of FIG. 8 with a He gas concentration Ci being indicated on an axis of abscissas. FIG. 11 also shows results in the case of a reactant gas partial pressure being relatively high (16 Torr), in addition to the conditions in FIG. 8. It can be confirmed from FIG. 11 that under the condition of the He gas concentration $C_i$ being at least 0.8, plasma can be maintained stable in any reactant gas partial pressure Pr. Addition of the conditions prescribed by the formula (B) to the formula (A) is preferable from the results.

$$P(Torr) \leq 5 \times Pr(Torr) = P_{L2} \tag{B}$$

In addition, while FIG. 8 shows pressure range prescribed by the formula (B) relative to data indicated by O plot and ● plot, it is preferable that to improve the plasma stability further, the He gas concentration Ci be set to be somewhat high in the range prescribed by the formula (B). Actually, it suffices to select a plasma processing gas pressure P, by which the plasma processing rate is most increased, in that range, which satisfies the formulae (A) and (B).

The meaning of the plasma processing gas pressure P prescribed by the formulae (A) and (B) can be more definitely confirmed by referring to FIG. 12. FIG. 12 is obtained by rewriting a graph of FIG. 8 with the plasma processing gas pressure P to the minus one-half power ($P^{-0.5}$) plotted in abscissa. In the figure, in the case where $P(^{-0.5})$ assumes a relatively small value on less than the order of 0.3 [$Torr^{-0.5}$], the film forming rate (deposition rate) increases substantially in proportion to the plasma processing gas pressure P to the minus one-half power ($P^{-0.5}$), as with the case in etching (FIG. 2). This result indicates that the film forming rate (deposition rate) increases due to an increase in drift velocity of electrons, caused by reduction in a plasma processing gas pressure P.

It can be confirmed from the experimental fact that the pressure range prescribed by the formula (A) is appropriate. Also, in the case where $P(^{-0.5})$ assumes a relatively large value on the order of more than 0.3 [$Torr^{-0.5}$], linearity of the film forming rate (deposition rate) relative to $P(^{-0.5})$ is lost, which corresponds to plasma stability being reduced as described above. Then a pressure, which can maintain plasma stable, is given by the above formula (B). In addition, FIG. 12 shows a range of pressure prescribed by the formula (B) for plot and ε plot.

As described above, the plasma processing rate can be greatly enhanced in the present embodiment by setting a plasma processing gas pressure P to a low level, which is within a range prescribed by the formula (A) and a range in which plasma can be maintained stable. The above pressure, by which plasma can be maintained stable, was prescribed by the formula (B).

Subsequently, an explanation will be given to a pressure range, which is within a range of a plasma processing gas pressure P prescribed by the formulae (A) and (B), and is more preferable.

FIG. 13 is a graph similar to that in FIG. 8, and shows pressure ranges prescribed by the formulae (A), (B) and (C), relative to the respective plots. In addition, the formula (C) is given by the following one.

$$P(Torr) \leq 3.5 \times P_L(Torr) \quad (C)$$

In the formula (C), a pressure $P_L$(Torr) is a higher one of the pressure $P_{L1}$(Torr) represented by the formula (D) and the pressure $P_{L2}$(Torr) represented by the formula (E) for a frequency f(Hz) of high frequency power and a reactant gas partial pressure Pr(Torr).

$$P_L(Torr) = P_{L1}(Torr) = 2 \times 10^{-7}(Torr/Hz) \times f(Hz) \quad (D)$$

$$P_L(Torr) = P_{L2}(Torr) = 5 \times Pr(Torr) \quad (E)$$

As apparent from FIG. 13, it is seen that a maximum value of the plasma processing rate is present in the range of a plasma processing gas pressure P prescribed by the formulae (A) to (C). This result corresponds to an image view shown in FIG. 6(c). In addition, the range of a plasma processing gas pressure prescribed by the formulae (A) to (C) is a quantitative representation of "setting the plasma processing gas pressure to a low level (C), which is within a range prescribed by the formula (A) and a range in which plasma can be maintained stable (B)".

Then, the characteristics of the amorphous Si thin film manufactured according to the present invention was investigated. In FIG. 14, photo sensitivity of the Si thin film manufactured under the conditions shown in FIG. 13 is plotted relative to a plasma processing gas pressure P. It is seen from comparison between FIG. 14 and FIG. 13 that the photo sensitivity assumes a maximum value near the plasma processing gas pressure P, at which the film forming rate (deposition rate) becomes maximum. While the reason for this is not definite, it is believed that reactive species desired for thin film formation are generated under the pressure condition (the formulae (A) to (C)) for efficient decomposition of a reactant gas with the stability of plasma. In addition, understanding of the above phenomenon leads to an estimation that, for example, efficient decomposition of a reactant gas results in suppressing polymerization of the reactive species as decomposed with reactant gas molecules (parent molecules) because the parent molecules decease, and a He gas is included in a suitable amount to thereby adjust a gas temperature appropriately, but any definite knowledge has not been obtained.

As described above, the following has been concretely ascertained in the present embodiment.

1) The limitation on a plasma processing gas pressure P, prescribed by the formula (A) is not dependent upon a type of a reactant gas, and is applicable to any type of reactant gas.

2) Addition of the limitations indicated by the formula (B) or (C) to the conditions of a plasma processing gas pressure P prescribed by the formula (A) is effective in increasing a plasma processing rate.

3) By setting a plasma processing gas pressure in the range prescribed by the formulae (A) to (C), it is possible to satisfy both increasing the film forming rate (deposition rate) and making a thin film good in quality. That is, the present invention is particularly effective in the case of a plasma processing method being a thin film forming deposition method.

MODIFIED EXAMPLE 1

In the above embodiment, the experimental results are demonstrated in the case where He is used as an inert gas. However, an inert gas in the present invention is not limitative. As an example, an experiment was carried out with the use of Ar as an inert gas. Experimental conditions are the same as shown by O plot in FIG. 8, and a plasma processing gas pressure P was 8 Torr. As a result, a film forming rate (deposition rate) was 25 Å/s, and there was not much difference as compared in the use of He. Also, an amorphous Si thin film which had the photo sensitivity of $5 \times 10^5$ or more was obtained.

MODIFIED EXAMPLE 2

With respect to the above embodiments and the modified examples, an explanation has been given to the case where a plasma processing gas was a mixture gas of a reactant gas and an inert gas. However, the pressure range of a plasma processing gas prescribed by the formula (A) indicates one, in which drift velocity of electrons was increased by reduction in pressure. Accordingly, this point of view holds true even if the plasma processing gas consists of only a reactant gas. In this case, however, increasing the drift velocity of electrons by decreasing the plasma processing gas P in pressure leads simultaneously to reduction in a reactant gas partial pressure Pr, and so it is necessary to contemplate trade-off of opposing effects. Also, to maintain plasma with only a reactant gas, it is necessary to load a large amount of high-frequency power.

MODIFIED EXAMPLE 3

In the above embodiments and the modified examples, results were shown, in which an apparatus shown in FIG. 4 was used as a plasma processing apparatus. However, any type of plasma processing apparatus may be used in the present invention. As an example, a similar experiment to that in FIG. 8 was carried out with the use of a plasma processing apparatus of well known shower type electrode. As compared with data in FIG. 8, a film forming rate (deposition rate) assumed a higher value by several percentages, but possessed a similar tendency to that in FIG. 8.

Drift Velocity of Electrons

To complement the contents described above, an explanation will be given to the drift velocity of electrons.

Individual electrons in plasma move as a whole toward an electric field while colliding against other particles at random velocity due to thermal motion. Such velocity of the entire motion corresponds to the drift velocity $V_d$ of electrons, and should be distinguished from random velocity of electrons. In addition, the random velocity of electrons is represented by distribution function, and dealt in average, which is referred to as thermal velocity $V_t$.

An equation for drift motion of electrons in the electric field is given by the following formula.

$$m \cdot dV_d/dt + v \cdot m \cdot V_d = e \cdot E \quad (1)$$

where m indicates mass of electron, $V_d$ drift velocity of electrons, and t time, $v$ frequency of collision (the number, in which one electron collides with other particles in a plasma processing gas per unit time), e electric charge of electron, and E an electric field given between an electrode and a substrate by high frequency power source, the E being represented by the formula (2), and the frequency $v$ of collision being represented by the formula (3).

$$E = E_O \cdot exp(j \cdot 2\pi \cdot f \cdot t) \quad (2)$$

$$v = V_t/\lambda \quad (3)$$

($E_O$: amplitude of high frequency electric field, f: frequency of high frequency power source, j: imaginary number, $\lambda$: near free path of electrons, $V_t$: thermal velocity of electrons)

The near free path $\lambda$ of electrons in the formula (3) is represented by the following formula.

$$\lambda = (k \cdot T_g/P)/(\pi r^2) \quad (5)$$

(k: Boltzman's constant, P: plasma processing gas pressure, r: average radius of particles present in a plasma processing gas, $T_g$: gas temperature)

Using the above formulae (1) to (5), an explanation will be given to the ground for the lower limit pressure $P_{L1}$ of a plasma processing gas pressure P prescribed by the formula (A) and dependency of drift velocity of electrons on a plasma processing gas pressure P.

[1] Re: Ground for the Lower Limit Pressure $P_{L1}$ of a Plasma Processing Gas Pressure P Solving the formula (1), $$V_d = (e \cdot E/m)/(j \cdot 2\pi \cdot f + v) \quad (6)$$

is obtained. By the way, the formula (6) is a solution assuming that frequency $v$ of collision is not dependent upon the drift velocity $V_d$, but is a prerequisite in the discussion of [1], which is not problematic. The reason for this is that the relationship $V_t > V_d$ is present in general plasma processing and the lower limit pressure $P_{L1}$ in [1] is discussed by dealing $V_t$ as in the following formula (13). From the formula (b) the relationship between a frequency f of high frequency power and drift velocity $V_d$ of electrons is as shown in FIG. 3. In FIG. 3, $f_c$ is a critical frequency, below which electrons follow the high-frequency electric field, and is referred to as critical frequency in the present invention. The critical frequency $f_c$ is represented by the following formula.

$$f_c = v/(2\pi) \quad (7)$$

From the formulae (3), (5) and (7), $f_c$ is represented by the following formula.

$$f_c = v/(2\pi) = V_t/\lambda/(2\pi) = V_t/\{$$

$$(k \cdot T_g/P)/(\pi r^2)\}/$$

It is found from the formula (8) that the critical frequency $f_c$ increases with an increase in the plasma processing gas pressure P.

Here, depending upon the relationship in magnitude between a frequency f of high frequency power and the critical frequency $f_c$, the formula (6) is approximated by the following formula.

When the frequency f assumes the relationship $f \ll f_c$, $$V_d = (e \cdot E)/(m \cdot v) \quad (9)$$

When the frequency f assumes the relationship $f \ll f_c$, $$V_d = (e \cdot E/m)/(j \cdot 2\pi \cdot f) \quad (10)$$

It follows from the formula (9) that in the case of using a frequency represented by $f \ll f_c$, the drift velocity Vd increases when the frequency $v$ of collision decreases.

Accordingly, the plasma processing gas pressure P is reduced to thereby decrease the frequency $v$ of collision of electrons with particles in a plasma processing gas and the drift velocity $V_d$ increases. In addition, the fact that the frequency $v$ of collision is reduced by lowering a plasma processing gas pressure in the case where a plasma processing gas is composed of a mixture gas of a reactant gas and an inert gas, and a reactant gas partial pressure is constant, means that a frequency $v$ of collision of electrons with molecules of an inert gas decreases. And the frequency of collision of electrons with an inert gas is reduced whereby the drift velocity is increased. Since the present invention makes use of an increase in the drift velocity, it is necessary to meet a relationship $f \leq f_c$.

Therefore, the present invention functions effectively in a plasma processing gas pressure P, which satisfies the following formula derived from the formula (8).

$$f_c = V_t \cdot P \cdot r^2/(2k \cdot T_g) \geq f \quad (11)$$

Transforming the formula (11), the following formula is obtained.

$$P \geq \{(2k \cdot T_g)/(V_t \cdot r^2)\} \cdot f \quad (12)$$

Here, when an electric field is intense and the drift velocity becomes great, the thermal velocity $V_t$ of electrons is liable to increase, and satisfies at least the following relationship.

$$Vt \geq \{(8 \cdot k \cdot T_e)/(\pi \cdot m)\}^{1/2} \quad (13)$$

(Te: temperature of electrons)

In addition, a right side of the formula (13) indicates an average velocity when a random velocity of electrons follows Maxwell's velocity distribution.

Accordingly, it suffices that at least a relationship represented by the following formula derived from the formulae (12), (13) is met.

$$P \geq [(2k \cdot T_g) \cdot \{(8 \cdot k \cdot T_e)/(\pi \cdot m)\}$$

$$^{-1/2} \cdot r^{-2}] \cdot f = [$$

$$\{T_g \cdot T_e^{-1/2}\} ] \cdot f \quad (14)$$

Here, a gas temperature $T_g$ and a temperature $T_e$ of electrons vary depending upon pressure, and possess at least the following formulae.

$$T_g \leq 5000K, \ T_e \geq 5000K \quad (15)$$

Here, substituting $k = 1.38 \times 10^{-23}$(J/K), $m = 9.11 \times 10^{-31}$(kg) into the formula (14) and taken account of the relationship represented by the formula (15), the following formula is obtained as a sufficient condition, which satisfies $f \leq f_c$.

$$P \geq [3.13 \times 10^{-25}(N/Hz)/r^2(m^2)] \cdot f(Hz) \quad (15')$$

Now, assuming that a major part of a plasma processing gas is composed of a He gas, and substituting $r = 1.1 \times 10^{-10}$ (m) into the formula (15), the following formula is obtained.

$$P \geq \{2.6 \times 10^{-5}(Pa/Hz)\} \cdot f(Hz) = \{2 \times 10^{-7}(Torr/Hz)\} \cdot f$$

$$(Hz) = P_{L1} \quad (16)$$

Accordingly, if a plasma processing gas pressure is in the range, which satisfies the formula (16) for a frequency f(Hz), the drift velocity can be approximated by the formula (9) and increases as the plasma processing gas pressure decreases. This is responsible for the lower limit on the plasma processing gas pressure indicated by the above formula (F). In addition, the formula (16) is found with atomic radius of a He gas, and the formula (16) serves as a sufficient condition for particles having a greater radius than that of He since a value of the right side of the formula (15') becomes small in the case where particles, for example, Ar, having a greater atomic radius of that of a He gas.

[2] Re: Dependency of Drift Velocity of Electrons on a Plasma Processing Gas Pressure P An explanation will be given to dependency of drift velocity of electrons on a plasma processing gas pressure. As described above, according to the present invention, a plasma processing gas pressure P is set to satisfy the relationship of the formula (16) for a frequency f used, and so $f \leq f_c$ is met. Accordingly, the term $m \cdot dVd/dt$ in the formula (1)) which represents the inertial effect of electrons, can be neglected in such frequency f(Hz), drift velocity of electrons being represented by the following formula, as indicated substantially in the formula (9).

$$V_d = (e \cdot E)/(m \cdot v) \quad (17)$$

Here, mass of electron is small, and so electrons are liable to be accelerated by an electric field. Therefore, in the case of an intense electric field, it is thought that electrons loose a portion a of kinetic energy due to collision with other particles, and get energy equivalent to that lost. That is, the following formula is established.

$$e \cdot E \cdot V_d = \alpha \cdot \{(1/2) \cdot m \cdot V_t^2\} \cdot v \quad (18)$$

Using the relationship of the formula (3), and solving simultaneous equations composed of the formulae (17) and (18), the following formula is obtained.

$$V_d = (\alpha/2)^{1/4} \cdot (e \cdot E \cdot \lambda/m)^{1/2} \quad (19)$$

As the near free path $\lambda$ is represented $\lambda \propto P^{-1}$ from the formula (5), the following formula is established.

$$V_d \propto P^{1/2} \quad (20)$$

In addition, the formula (19) can be represented in the following manner with the use of the formula (2).

$$V_d = \pm(\alpha/2)^{1/4} \cdot (e \cdot E_O \cdot \lambda/m)^{1/2} \times |\sin(2\pi \cdot f \cdot t)|^{1/2} \quad (21)$$

(the sign + applies in the case of $\sin(2\pi \cdot f \cdot t) \geq 0$, and the sign − applies in the case of $\sin(2\pi \cdot f \cdot t) < 0$)

From the formula (21), amplitude A (peak-to-peak) of vibration of electrons based on the drift motion is represented the following manner.

$$A = \int_0^{1/2f} V_d \, dt = 0.4 \cdot (\alpha/2)^{1/4} (e \cdot E_0 \cdot \lambda/m)^{1/2}/f \quad (22)$$

It is seen from the formula (22) that when the frequency f becomes high, the amplitude of vibration of electrons becomes small, and so damages on the substrate are reduced. In addition, if ions are affected by a high-frequency electric field, amplitude of vibration of ions is represented by the formula similar to the formula (22), and when the frequency f becomes high, damages by ions are reduced.

As described above, if a plasma processing gas pressure satisfies the formula (16), drift velocity of electrons increases by decreasing the plasma processing gas pressure in accordance with the formula (20). Such drift velocity is in proportion to (−½) power of the plasma processing gas pressure. The present invention increases drift velocity of electrons to increase the number of collisions of electrons and reactant gas molecules per unit time, thus efficiently decomposing the reactant gas molecules.

According to the present invention, a plasma processing gas pressure P(Torr) is set in a plasma processing method so as to meet the relationship $$2 \times 10^{-7} (Torr/Hz) \times f(Hz) \leq P(Torr) \leq 500 \; (Torr)$$

for a frequency f(Hz) of high frequency power supplied to electrodes, so that an efficiency of use of high-frequency energy and a reactant gas in a plasma processing gas is enhanced and so the processing rate can be greatly enhanced even under the condition that high-frequency power and a reactant gas partial pressure are constant.

Further, according to the present invention, while the processing rate for plasma processing is enhanced, a plasma processing gas pressure is equal to or less than 500 Torr, so that an amount of a gas introduced into a reaction vessel is made small as compared with the case where the pressure is 1 atmospheric pressure. That is, cost for gases can be reduced.

What is claimed is:

1. A plasma processing method comprising:
   supporting a substrate to be opposed to an electrode;
   setting a variable frequency of high frequency power f(Hz);
   providing a plasma processing gas, wherein said plasma processing gas is a mixture gas of an inert gas group and a reactant gas group, wherein said reactant gas group at least contains a gas including silicon atoms or a halogen base gas;
   setting a variable partial pressure of said reactant gas group $P_r$(Torr);
   setting the plasma processing gas to pressure P(Torr) where P(Torr) satisfies the following relationship $$P_L(Torr) \leq P(Torr) \leq P_H(Torr)$$

wherein the pressure $P_L$(Torr) is a higher pressure of either one represented by the following relationship $$P_L(Torr) = 5 \times P_r(Torr) \text{ or}$$

$$P_L(Torr) = 2 \times 10^{-7} (Torr/HZ) \times f(HZ)$$

and the pressure $P_H$(Torr) is a lower one of pressures represented by the following relationships $$P_H(Torr) = 3.5 \times P_L(Torr) \text{ and}$$

$$P_H(Torr) = 500 \; (Torr);$$

supplying high frequency power between the electrode and a holder to generate plasma between the electrode and the substrate on the basis of said plasma processing gas; and
   performing high rate plasma processing on the substrate utilizing the generated plasma.

2. The plasma processing method according to claim 1, wherein said inert gas group contains a He gas.

3. The plasma processing method according to claim 1, wherein said reactant gas group contains a gas including silicon atoms, and the plasma processing method is one for performing high rate film forming processing on the substrate.

4. The plasma processing method of claim 1, wherein said reactant gas group contains a halogen base gas, and the plasma processing method is one for performing high rate etching on the substrate.

5. The plasma processing method according to claim 3, wherein said gas including silicon atoms is $SiH_4$ or $Si_2H_6$.

6. The plasma processing method according to claim 4, wherein said halogen base gas is $SF_6$, $CF_4$, $C_2F_6$, $C_3F_8$, $CCl_4$, or $PCl_3$.

* * * * *